(12) United States Patent
Lapins et al.

(10) Patent No.: US 10,409,591 B2
(45) Date of Patent: Sep. 10, 2019

(54) DEVICE, SYSTEM AND METHOD FOR CONTROLLING AN OPERATION

(71) Applicant: Lapins Holdings Pty Ltd as Trustee for the Lapins Family Trust, Canning Vale, Western Australia (AU)

(72) Inventors: Mark Andrew Lapins, Canning Vale (AU); John David Hennessy, Joondalup (AU); Jasen Andrew Hill, Rowville (AU)

(73) Assignee: Lapins Holdings Pty Ltd, Canning Vale, Western Australia (AU), as Trustee for the Lapins Family Trust ( * ) Notice: Subject to any disclaimer, the term of this patent is extended or adjusted under 35 U.S.C. 154(b) by 703 days.

(21) Appl. No.: 14/423,655

(22) PCT Filed: Aug. 20, 2013

(86) PCT No.: PCT/AU2013/000924
§ 371 (c)(1),
(2) Date: Feb. 24, 2015

(87) PCT Pub. No.: WO2014/028967
PCT Pub. Date: Feb. 27, 2014

(65) Prior Publication Data
US 2015/0220337 A1    Aug. 6, 2015

(30) Foreign Application Priority Data

Aug. 24, 2012  (AU) ................................. 2012903669
Apr. 12, 2013  (AU) ................................. 2013204864

(51) Int. Cl.
*G06F 9/00*     (2006.01)
*G06F 9/30*     (2018.01)
(Continued)

(52) U.S. Cl.
CPC ............... *G06F 9/30* (2013.01); *G06F 3/016* (2013.01); *G06F 3/041* (2013.01); *G06F 3/0482* (2013.01);
(Continued)

(58) Field of Classification Search
CPC .... G06F 9/30; G06F 9/00; G06F 3/00; H03K 17/00
(Continued)

(56) References Cited

U.S. PATENT DOCUMENTS 6,127,941 A * 10/2000 Van Ryzin ............. G08C 17/02
340/12.53
6,140,987 A * 10/2000 Stein ...................... H01H 13/70
345/173

(Continued)

FOREIGN PATENT DOCUMENTS

CA       2633200 A1    1/2011
EP       1471717 B1    2/2007
(Continued)

OTHER PUBLICATIONS

International Search Report and Written Opinion of the ISA for PCT/AU2013/000924, ISA/AU, Woden, ACT, dated Sep. 11, 2013.
(Continued)

*Primary Examiner* — Rexford N Barnie
*Assistant Examiner* — Joseph N Inge
(74) *Attorney, Agent, or Firm* — Harness, Dickey & Pierce, P.L.C.

(57) ABSTRACT

A device (10) for controlling an operation, the device comprising: a controller (12); a storage means (14) for storing electronic program instructions for controlling the controller; and an input means (16); wherein the controller is operable, under control of the electronic program instructions, to: receive at least one instruction via the input means,
(Continued)

the at least one instruction comprising a command associated with the operation; and implement the operation according to the command.

29 Claims, 26 Drawing Sheets

(51) Int. Cl.
| | |
|---|---|
| *G06F 3/0488* | (2013.01) |
| *G06F 3/01* | (2006.01) |
| *G06F 3/041* | (2006.01) |
| *G06F 3/0484* | (2013.01) |
| *G06F 3/0482* | (2013.01) |
| *H03K 17/94* | (2006.01) |

(52) U.S. Cl.
CPC ........ *G06F 3/0488* (2013.01); *G06F 3/04847* (2013.01); *H03K 17/94* (2013.01); *G06F 2203/04101* (2013.01); *Y10T 307/937* (2015.04)

(58) Field of Classification Search
USPC .......................................................... 307/139
See application file for complete search history.

(56) References Cited

U.S. PATENT DOCUMENTS

| | | | | |
|---|---|---|---|---|
| 6,752,946 | B2* | 6/2004 | Toyooka | B29C 43/40 264/154 |
| 6,933,686 | B1 | 8/2005 | Bishel | |
| 6,989,763 | B2* | 1/2006 | Wall | G08C 19/28 340/12.25 |
| 7,248,892 | B2* | 7/2007 | White | B23Q 1/0009 455/550.1 |
| 7,313,422 | B2 | 12/2007 | White et al. | |
| 7,373,170 | B2 | 5/2008 | White et al. | |
| 7,376,439 | B2 | 5/2008 | White et al. | |
| 7,392,059 | B2 | 6/2008 | White et al. | |
| 2001/0045803 | A1 | 11/2001 | Cencur | |
| 2005/0269196 | A1* | 12/2005 | Brown | H01H 13/70 200/502 |
| 2006/0065510 | A1 | 3/2006 | Kiko et al. | |
| 2008/0144262 | A1* | 6/2008 | Lai | G06F 1/1616 361/679.17 |
| 2011/0065293 | A1 | 3/2011 | Zhu | |

FOREIGN PATENT DOCUMENTS

| | | |
|---|---|---|
| EP | 2317605 A1 | 5/2011 |
| JP | H07010776 U | 2/1995 |
| JP | H09331588 A | 12/1997 |
| JP | 2004-530380 A | 9/2004 |

OTHER PUBLICATIONS

International Preliminary Report on Patentability, IPEA/AU, Woden ACT, dated Aug. 14, 2014.
New Zealand Examination Report for New Zealand Serial No. 705286, dated Jan. 30, 2018.
European Article 94(3) EPC Communication and accompanying EPO Form 2906 dated Sep. 14, 2017 from corresponding European Serial No. 138310370.
Hewlett-Packard Company et al: "Universal Serial Bus 3.0 Specification. Revisions 1.0", Nov. 12, 2008, XP055105724.
Australia Office Action dated Sep. 5, 2014 from corresponding Australia Serial No. 2013204864.
Australia Office Action dated Sep. 25, 2014 from corresponding Australia Serial No. 2013204864.
Chinese Office Action dated Sep. 30, 2016 from corresponding Chinese Serial No. 2013800510243 (in Chinese and English).
Chinese Office Action dated Jun. 22, 2017 from corresponding Chinese Serial No. 2017061901621480 (in Chinese and English).
European Communication and Search Report dated Apr. 18, 2016 from corresponding European Serial No. 138310370.
Japanese Search Report dated Jun. 21, 2016 from corresponding Japanese Serial No. 2015527739 (in Japanese and English).
Mexico Office Action dated Jan. 13, 2017 from corresponding Mexico Serial No. MX/a/2015/002434 (in Mexican and English).
Mexico Office Action dated Aug. 16, 2017 from corresponding Mexico Serial No. MX/a/2015/002434 (in Mexican and English).
Morocco Office Action from corresponding Morocco Serial No. 37864 (date unknown—in Moroccan and English).
New Zealand Office Action dated Mar. 29, 2017 from corresponding New Zealand Serial No. 705286.
Oman Office Action dated May 10, 2017 from corresponding Oman Serial No. OM/P201500044 (Oman only; English not available).
Korea Office Action dated Apr. 4, 2016 from corresponding Korean Serial No. 1020157007052 (in Korean and English).
Korea Office Action dated Dec. 15, 2016 from corresponding Korean Serial No. 1020157007052 (in Korean and English).
Vietnam Office Action dated Sep. 25, 2015 from corresponding Vietnam Serial No. 1-2015-00980 (in Vietnamese and English).
European Article 94(3) EPC Communication and accompanying EPO Form 2906 dated Mar. 22, 2018 from corresponding European Serial No. 138310370, and attached KNX Sensor Reference Manual.
New Zealand Further Examination Report from corresponding New Zealand Serial No. 705286, dated May 11, 2018.
Korean Search Report and Examination Report from corresponding United Arab Emirates Serial No. 0246/2015 filed Feb. 24, 2015.
European Summons to attend oral proceedings pursuant to Rule 115(1) EPC and Annex Report to International Preliminary Examination Report App. Serial No. EP 13831037.0 dated Feb. 4, 2019.

\* cited by examiner

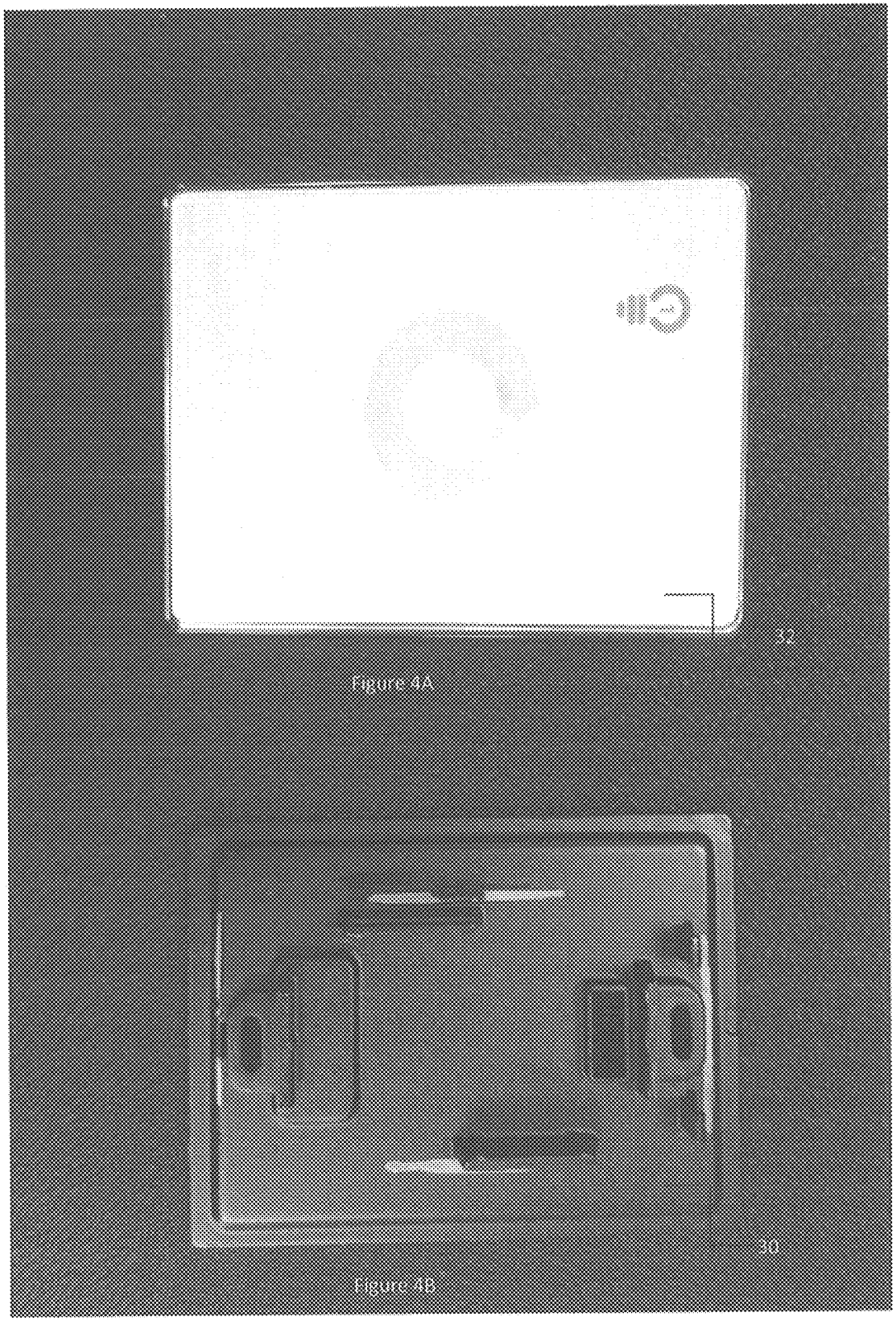

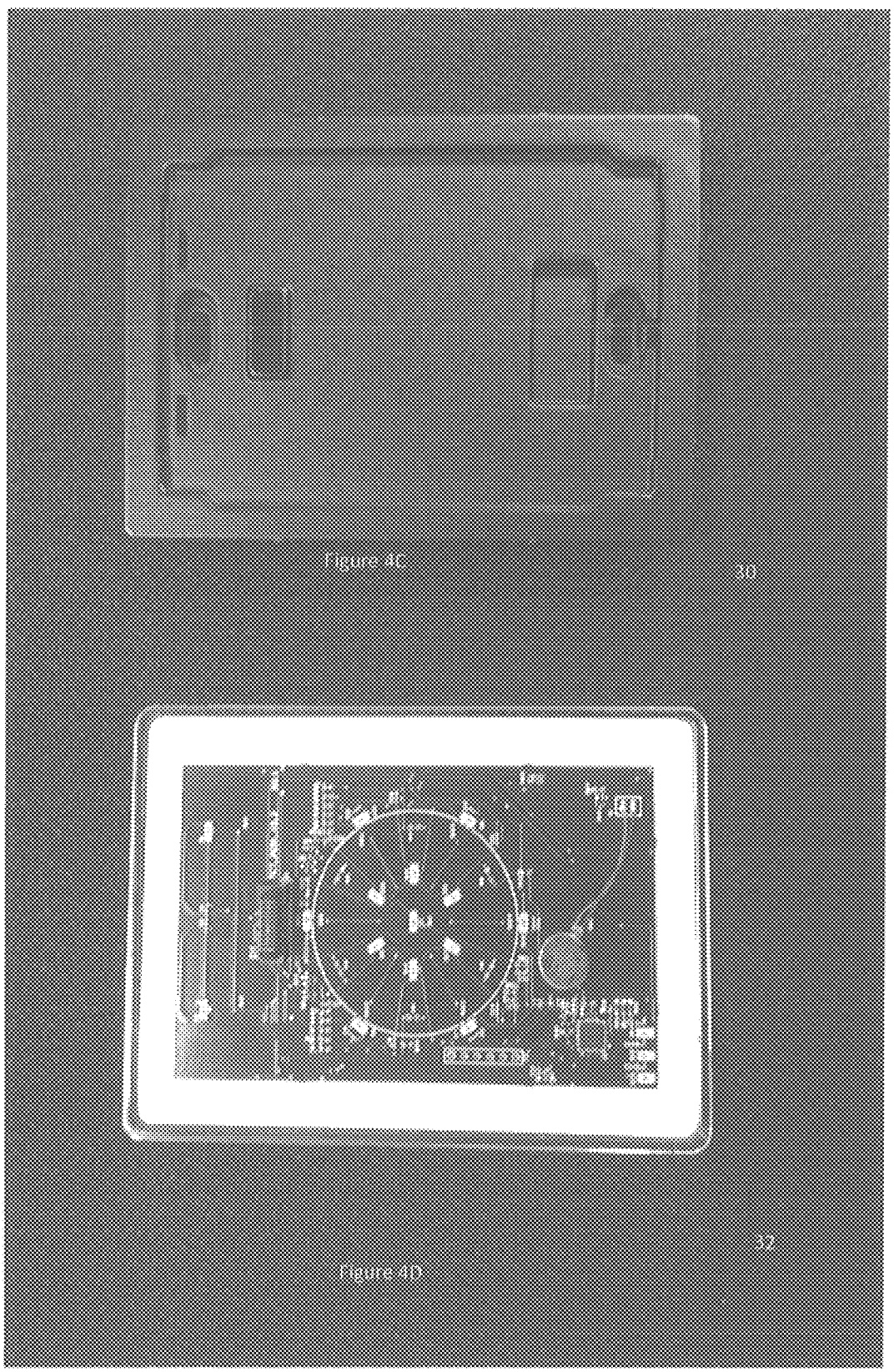

Figure 5B

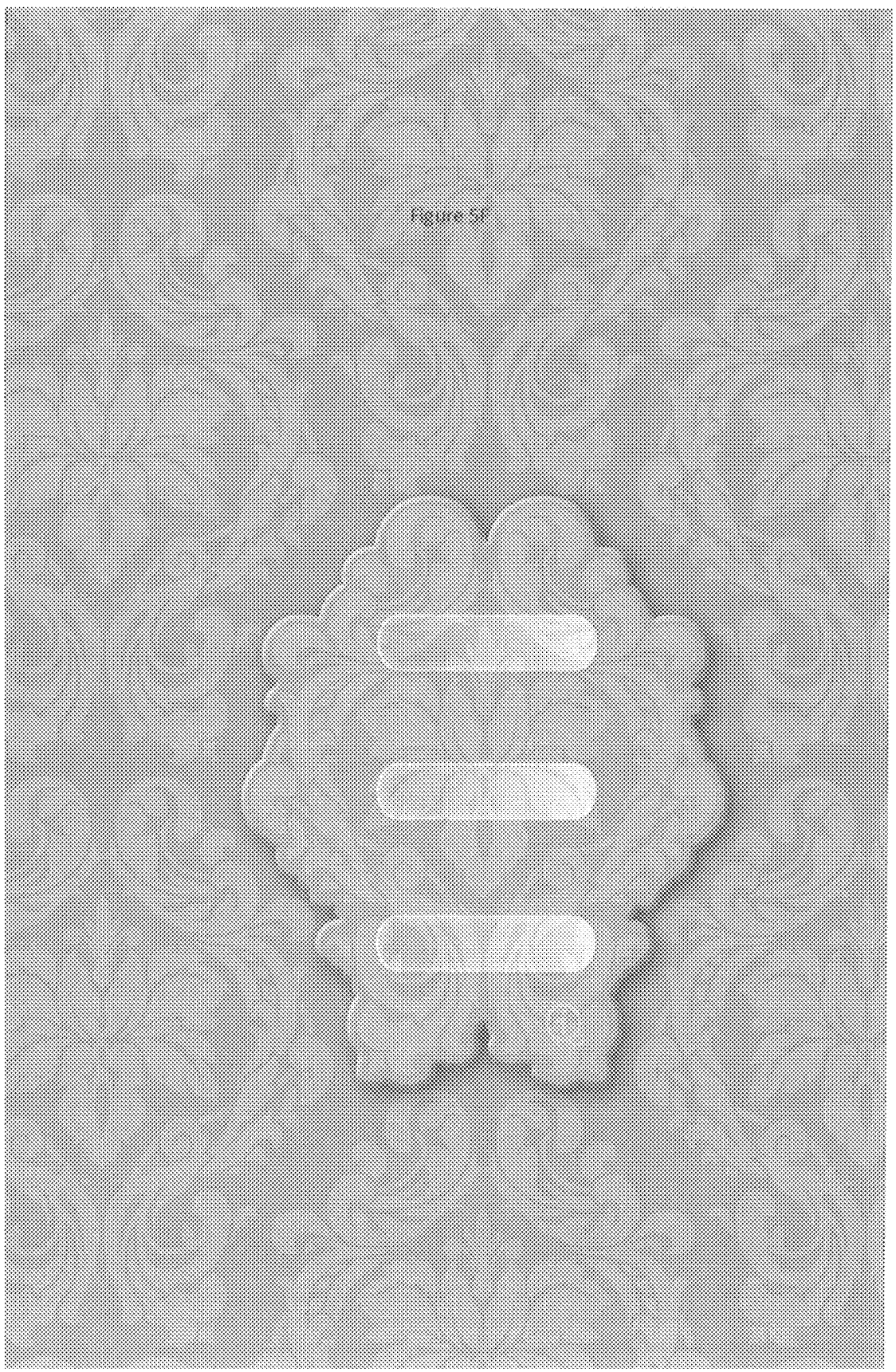

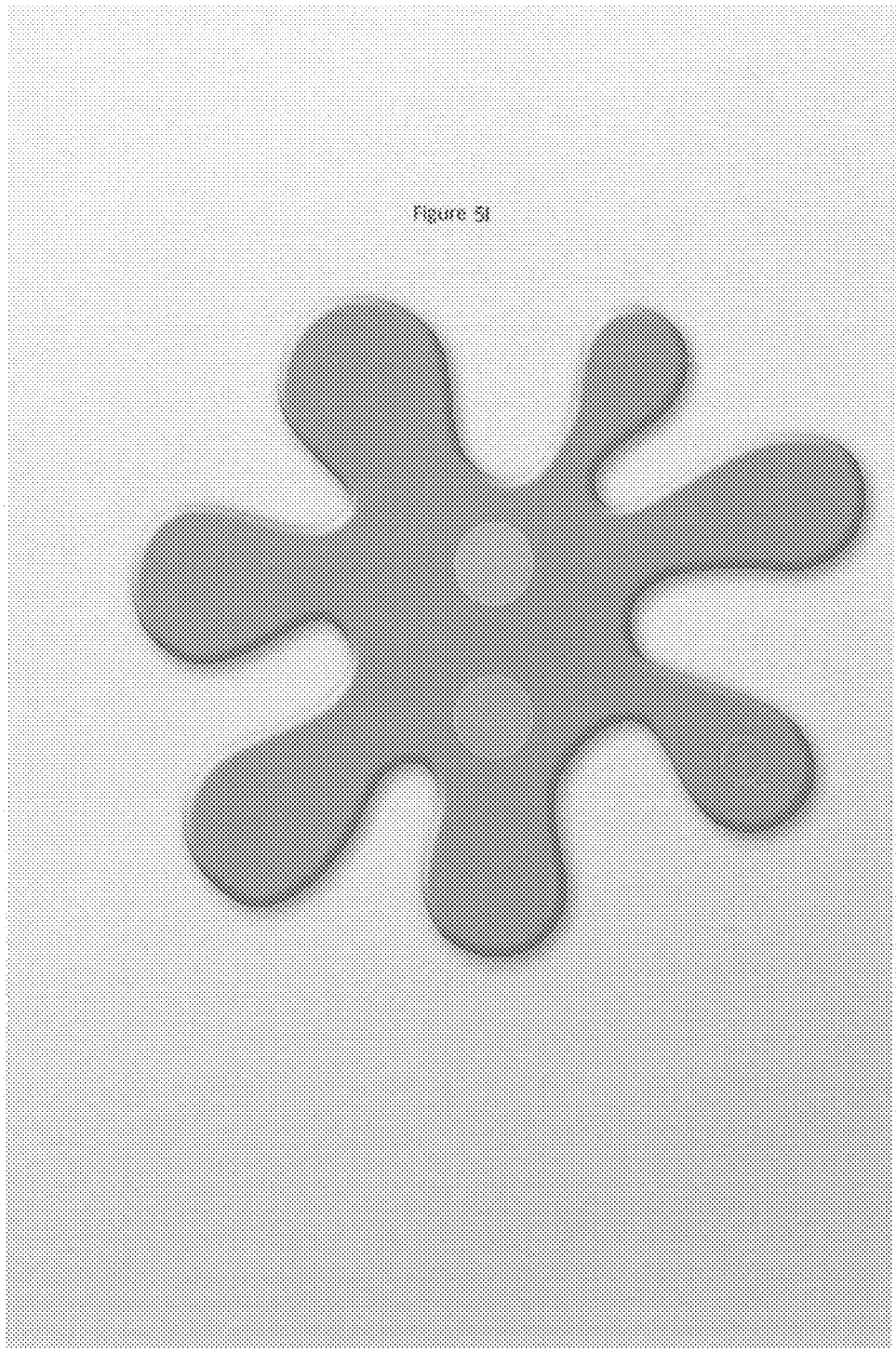

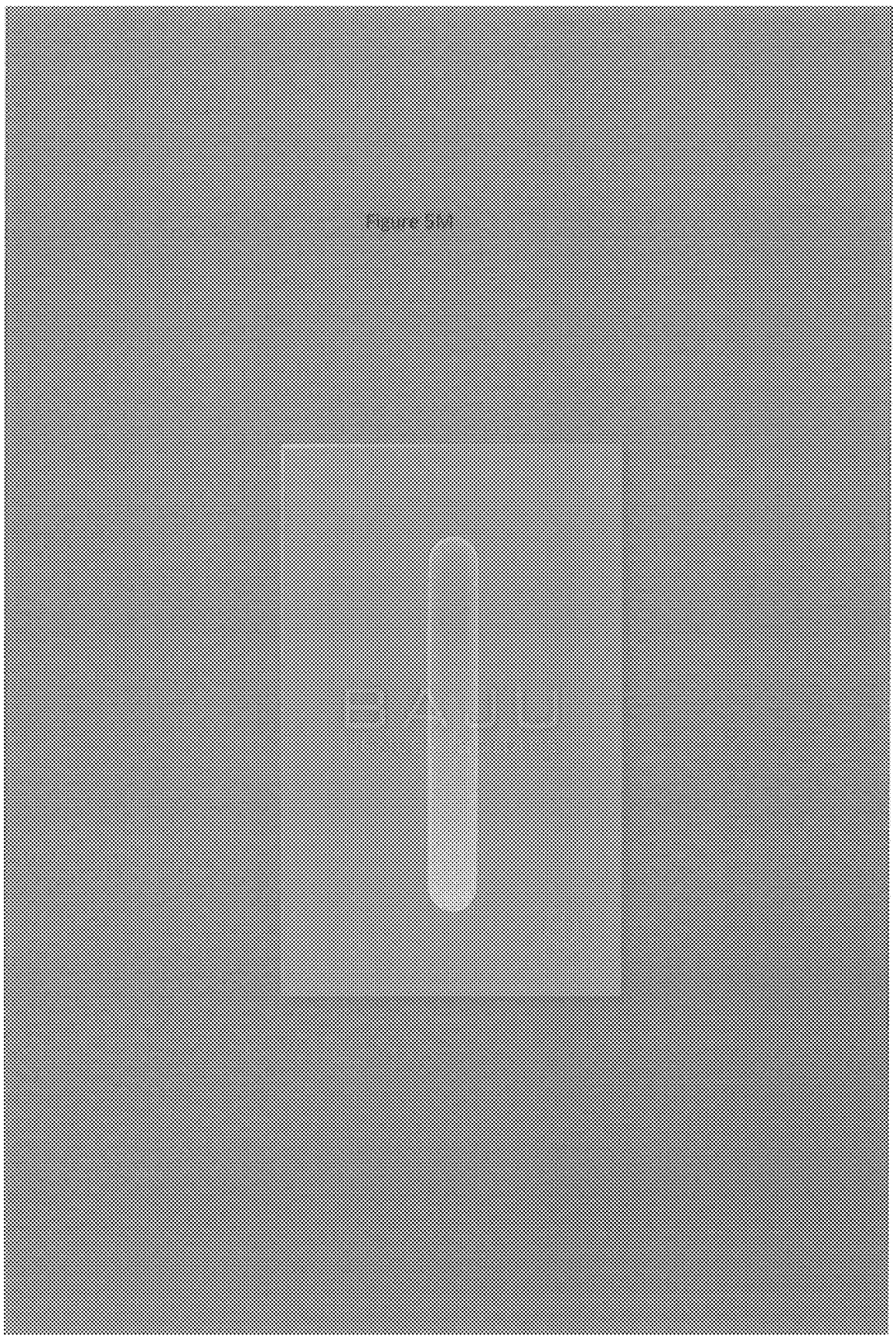

DEVICE, SYSTEM AND METHOD FOR CONTROLLING AN OPERATION

CROSS-REFERENCE TO RELATED APPLICATIONS

This application is a 371 U.S. National Stage of International Application No. PCT/AU2013/000924, filed Aug. 20, 2013, which claims the benefit and priority of Australian Provisional Patent Application No. 2012903669, filed Aug. 24, 2012 and Australian Standard Patent Application No. 2013204864, filed on Apr. 12, 2013. The entire disclosures of the above applications are incorporated herein by reference.

TECHNICAL FIELD

The present invention relates generally to a device, system and method for controlling an operation.

Although the present invention will be described with particular reference to controlling a an operation comprising a switching or signaling action or event for an electrical or electronic circuit, it will be appreciated that it may be used in respect of additional or alternative operations.

BACKGROUND ART

An electric switch is a device operable to interrupt or divert flow of electrical energy or current in an electrical or electronic circuit. That is, "break" the circuit.

Traditionally, an electric switch has the form of a manually operated electromechanical device comprising one or more sets of electrical contacts, which are connected to external circuits. Each set of contacts can be in a first or "closed" state, in which electrical energy can flow between the contacts, and a second or "open" state, in which there is no electrical energy flow between the contacts.

Early electric switches used "quick break" technology, such as the light switch invented by John Henry Holmes in 1884. His quick-break switch solved the problem of the contacts of an electric switch developing electric arcing whenever the circuit was opened or closed—a damaging condition that reduces an electric switch's working life.

Fundamentally, such switches operate by translation of a mechanical action into a switching action, with a first position of an actuating means such as a mechanical component of the switch, manually moveable by a user, corresponding to the closed state and a second position of the mechanical component corresponding to the open state.

In variations of the technology, rather than switching electricity, manipulation of the switch to the closed state closes a contact that does not switch electricity but rather provides an in put to signal an action. In this regard, many input devices for signaling systems are constructed using similar technology to electric switches.

This same technology, soft switching versions or variations of the same, or electronic derivatives of the technology where manual input (switching or signaling) is transferred to electrical signals, is still in use today in almost every ordinary switch in the world, controlling devices and systems including for example, those for lighting, heating and cooling, power, and generating an alert or alarm, such as a nurse call switch. Despite this ever growing list of applications for the switch, the device itself has, fundamentally, remained unchanged for over 50 years with the quick-break technology still in use in almost every ordinary light switch in the world today, as well as in many other forms of electric switch.

Differences between switches presently available reside mainly in their aesthetic design or appearance, and particularly in the type of actuating means. Popular varieties include push button, toggle, rocker, tamper resistant, voltage class, mercury, pull chain/cord, dimmer and electronic mechanisms.

Switches are often recessed within a finished wall of a construction. Typically, a pattress box houses the switch within a recess in the wall, and it is covered by a plastic, glass ceramic, or metal faceplate to prevent contact with live components such as terminals of the switch. There are various mounting techniques and methods employed to secure the switch in its desired location.

Typically, visual and tactile features of the switch and associated components, such as the shape, configuration, pattern, ornamentation, look and/or feel of the faceplate and actuating, means are available in a variety of fixed variations determined by a manufacturer of the switch.

Despite their ubiquity and longevity, the traditional switch has a number of inhere rat shortcomings or problems.

Firstly, as mentioned above, switches are manufacturer-defined. That is, the manufacturer decides on the aesthetics of the device such as the design, function, material and colour, according to what they believe are the needs of the market, and then produces them on a mass scale. The consumer is then left with the challenge of selecting the most suitable product according to the style, colour, décor and function of a room, for example, where the switch is to be installed. As a result, choice is limited to manufacturers' creativity rather than that of consumers.

A traditional switch comprises various mechanical parts; even newer developed electronic switches retain a number of mechanical or electro mechanical pieces as part of their construction. As with any mechanical or electro mechanical part, continued use causes wear and worn switches become less reliable and may present a safety risk or hazard. Any movement of electrical wiring associated with the switch can cause it to fray, increasing the likelihood of electrocution, fire or burns. Additionally, worn switches may become a fire or electrocution hazard. If exposed to moisture or direct water ingress, such as in a bathroom, kitchen or other wet area, the switch may also cause electrocution. Whilst waterproof switching is available to overcome this, they are generally not a décor item, do not match other switches that would be used in the same areas and are considerably more expensive as they are a specifically built switch.

Switches are actuated by touch which allows the transfer or transmission of microorganisms detrimental to human health. The faceplates of switches, for example, can become breeding grounds for pathogens such as bacterium, especially as the inherent design of a switch provides ample collection points such as irregular surface finishes or grooves on their outer surface. Environmental factors when switches are, for example, located in places like hospitals, bathrooms or kitchens add to the possibility of infection. Switches therefor by nature are responsible for the transfer of pathogens, the transfer of which is especially dangerous for a p ace such as a hospital or restaurant.

It is against this background that the present invention has been developed.

SUMMARY OF INVENTION

It is an object of the present invention to overcome, or at least ameliorate, one or more of the deficiencies of the prior art mentioned above, or to provide the consumer with a useful or commercial choice.

Other objects and advantages of the present invention will become apparent from the following description, taken in connection with the accompanying drawings, wherein, by way of illustration and example, a preferred embodiment of the present invention is disclosed.

According to a first broad aspect of the present invention, there is provided a device for controlling an operation, the device comprising:
   a controller;
   a storage means for storing electronic program instructions for controlling the controller; and
   first removable input means attachable to the device for controlling an operation;
   wherein the controller is operable, under control of the electronic program instructions, to:
   receive at least a first instruction via the first removable input means, the at least one instruction comprising a command associated with the operation; and
   implement the operation according to the command;
   wherein the first removable input means is adapted to be replaced with a second removable input means attachable to the device for controlling an operation; and
   wherein the second removable input means is adapted to provide at least a second instruction to the controller, the second instruction comprises a second command associated with a second operation; and
   implement the second operation according to the second command.

Preferably, the device further comprises an output means.

Preferably, the device further comprises connection means for operably connecting and disconnecting the input means and/or the output means to the device.

The input leans and/or the output means may comprise modules interchangeably collectable to the device.

The controller may comprise computer processing means, in which case the instruction may comprise, or be converted by operation of the input means, into data or at least one signal for the computer processing means.

The input means may comprise user input means, in which case the at least one instruction may comprise at least one user instruction inputted by a user via the user input means. Additionally, or alternatively, the input means may comprise machine input means, operable to receive at least one instruction from a machine, device or system.

The input means may comprise one or more sensors or detectors operable to sense data relating to or associated with the operation, the instruction and/or the command and to communicate the sensed data to the controller. The data communicated may comprise the instruction or command and/or a representation thereof.

Preferably, the device further comprises a display for displaying a user interface. The display may comprise a static display, and/or a dynamic display. In the case of a dynamic display, it may comprise a graphical display screen operable to be altered or updated electronically. Additionally, or alternatively, the display may comprise an indication means, which may comprise a visual indication, provided by one or more light sources such as a Light Emitting Diode (LED), a tactile indication, provided by one or more tactile sources such as a vibration generating device, and/or an aural indication, provided by one or more aural sources, such as a buzzer or alarm, for example.

The display, user interface and input means may be integrated, to allow for instructions to be inputted or received, and for output or feedback to be displayed. The integration may comprise a touchscreen implemented, for example, using Projected Capacitive Touch, Resistive Touch, and/or Inductive Touch technology. Alternatively, the display, user interface and input means may be discrete.

The output or feedback displayed may comprise a visual output, preferably including alphabetic, numeric and/or graphics, a tactile output, and/or an aural output, or a combination thereof.

Preferably, the display comprise a changeable fascia.

The display may be protected by a removable cover. Preferably, the cover adapted to prohibit or mitigate to at least some extent retention and/or transmission of at least one pathogen. In a preferred embodiment, the adaption comprises making the cover smooth or substantially smooth. Preferably, the cover is fabricated from at least one of a plastic, glass, metal, and/or antibacterial material. In a preferred form, the antibacterial material comprises inherently antibacterial silver ions.

Preferably, the operation comprises at least one of: a switching action; a signaling action; a recording action; a data logging action; and a power management action.

Preferably, the storage means is operable to store information or data. The information or data may be associated with the operation. In such an embodiment, where the display comprises a dynamic graphical display screen, it is preferred that the controller is operable, under control of the electronic program instructions, to display a list of available information or data via the display, and that the command comprises a selection of the available information or data from the list.

According to a second broad aspect of the present invention, there is provided a method for controlling an operation, the method comprising:
   storing electronic program instructions for controlling a controller; and
   controlling the controller via the electronic program instructions, to:
   receive at least one first instruction via a removable input means, the at least one first instruction comprising a command associated with the operation; and
   implement the operation according to the command;
   wherein the first removable input means is adapted to be replaced with a second removable input means attachable to the device for controlling an operation; and
   wherein the second removable input means is adapted to provide at least a second instruction to the controller, the second instruction comprises a second command associated with a second operation; and
   implement the second operation according to the second command.

BRIEF DESCRIPTION OF THE DRAWINGS

In order that the invention may be more fully understood and put into practice, preferred embodiments thereof will now be described with reference to the accompanying drawings, in which:

FIGS. 4A and 4D depict front views of a faceplate and a cover of the device of FIG. 1, and FIGS. 4C and 46 depict rear views of the faceplate and the cover of the device of FIG. 1;

DESCRIPTION OF EMBODIMENTS

Figure 1:
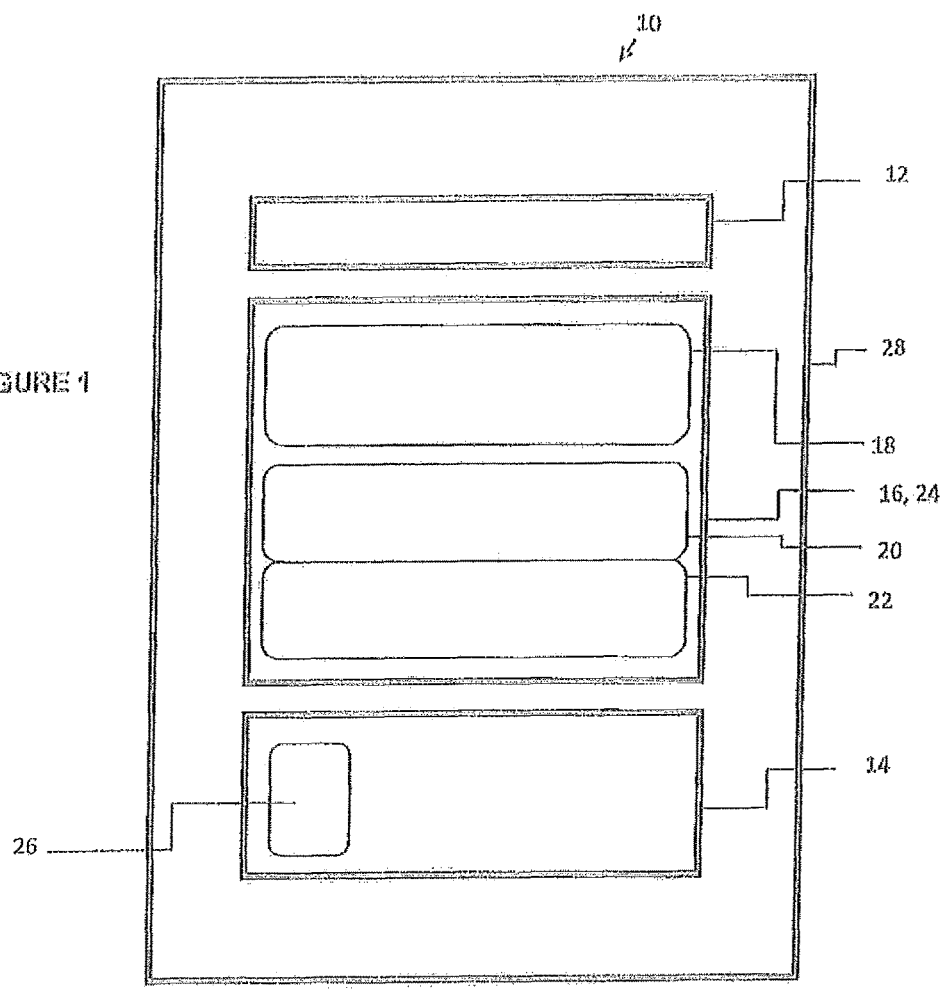
FIG. 1 depicts a schematic diagram of a device for controlling an operation in accordance with an aspect of the present invention.

In the drawings, like features have been referenced with like reference numbers.

Figure 2:
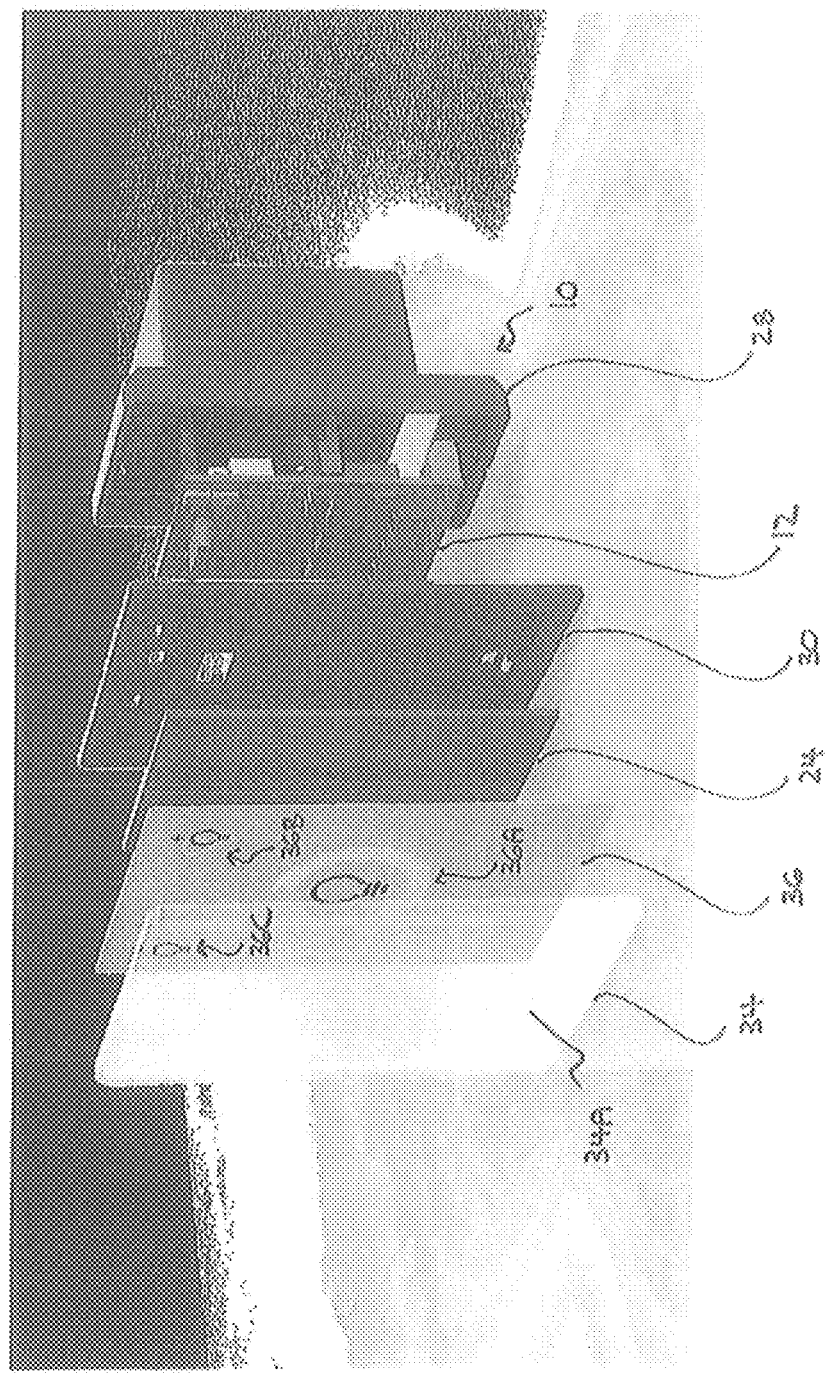
FIGS. 2 and 3 depict exploded diagrams of the device of FIG. 1.
Figure 3:
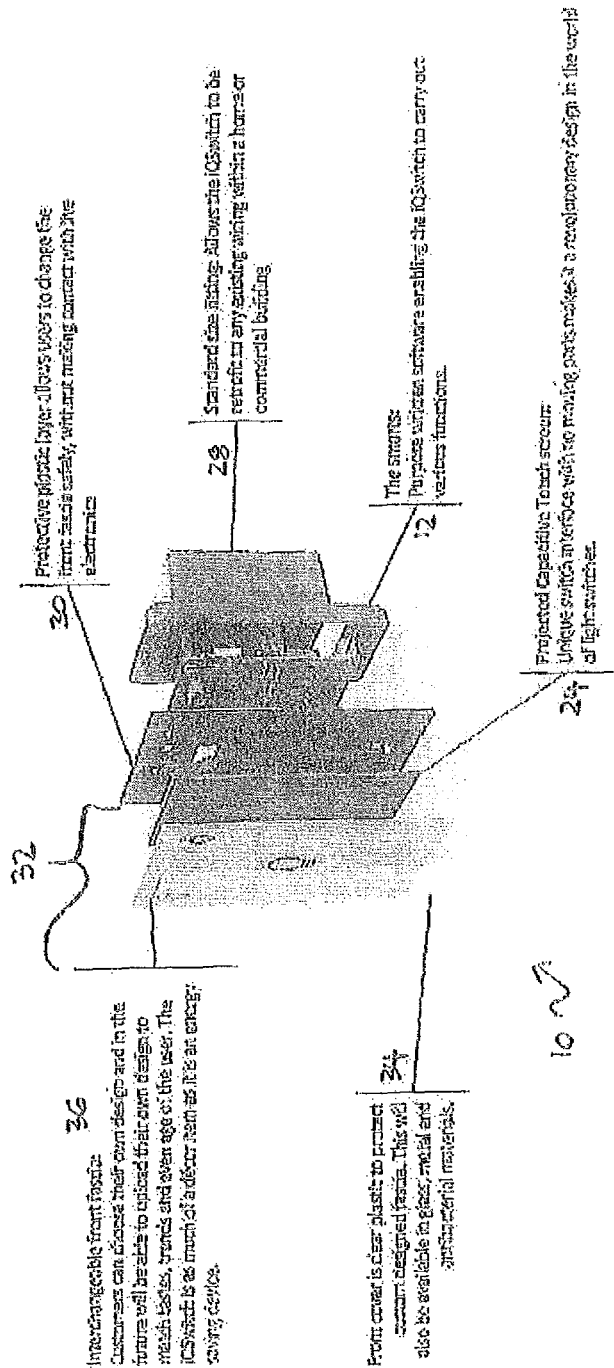
Figure 6:
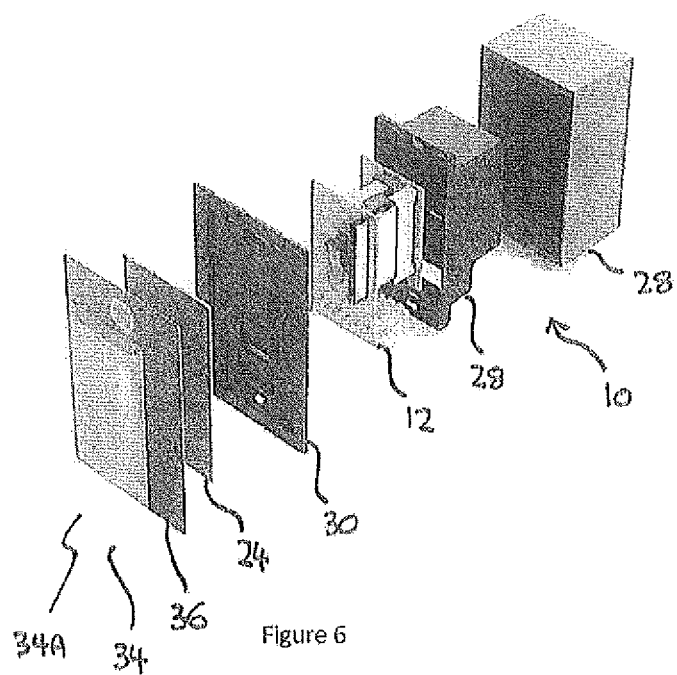
FIGS. 6 and 7 depict exploded diagrams of an alternative embodiment of the device of FIG. 1.
Figure 7:
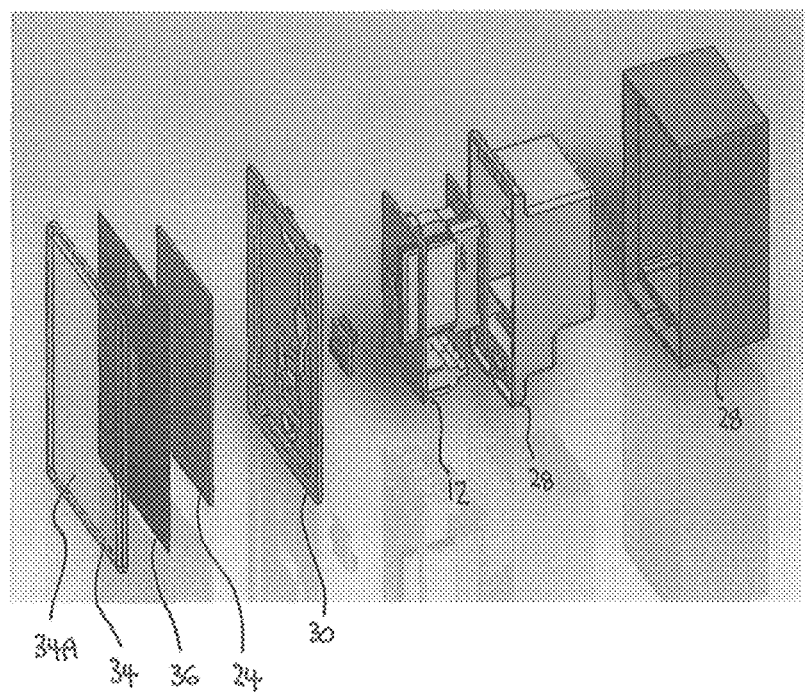

In FIGS. 1, 2 and 3, there is depicted an embodiment of a device 10 for controlling an operation in accordance with an aspect of the present invention. An alternative embodiment of the device 10 is depicted in FIGS. 6 and 7.

The device 10 comprises a plurality of components, subsystems or modules operably coupled via appropriate circuitry and connections to enable the device 10 to perform the functions and operations herein described. The device 10 comprises suitable components necessary to receive, store and execute appropriate computer instructions such as a method for controlling an operation in accordance with an embodiment of the present invention.

Particularly, the device 10 comprises computing means which in this embodiment comprises a controller 12 and a storage means, medium or device 14 for storing electronic program instructions for controlling the controller 12, and an input means 16. As will be described in further detail, the controller 12 is operable, under control of the electronic program instructions, to: receive at least one instruction via the input means, the at least one instruction comprising a command associated with the operation; and implement the operation according to the command. The instruction may comprise, or be converted by operation of the input means, into data or at least one signal for the controller 12.

In the embodiment described, the operation comprises a switching action or event, and the device 10 is operable to function as a light switch for lighting.

On receipt of a first instruction comprising a first or "on" command, the device 10 is operable to implement a first or "closed" state, in which electrical energy or current can flow between contacts of a lighting apparatus (not shown) coupled to the device 10, or to otherwise signal the lighting apparatus, to enter a first state or mode of operation. The first state or mode of operation of the lighting apparatus may comprise an "on" or active condition in which light is produced.

On receipt of a second instruction comprising a second or "off" command, the device 10 is operable to implement a second or "open" state, in which there is no electrical energy or current flow between contacts of the lighting apparatus, or to otherwise signal the lighting apparatus, to enter a second state or mode of operation. The second state or mode of operation of the lighting apparatus may comprise an "off" or inactive condition, in which no light is produced.

It should be appreciated that any apparatus, device or system desired to be controlled or operated may be operably coupled to the device 10, including those for lighting, heating and cooling, communication, including communication of voice and/or image data, access control, power, and generating an alert or alarm, such as a nurse call switch. For example, the technology of the invention is equally applicable to operation of general power outlets/general purpose outlets (GPOs) (electrical power points/sockets) and power boards and in one embodiment is adapted to allow for operable connection of devices or systems to a source of electrical energy. The devices or systems may comprise an alternating current (AC) powered device, in which case the adaption may comprise an electrical socket into which a corresponding connection of the device may be plugged. Once so connected to the device 10, the (power) controller 12 is operable to control the flow of energy from the electrical energy source to the device.

It should also be appreciated that the invention is not limited in regard to the operation, and in alternative embodiments may comprise additional and/or alternative operations comprising other actions or events, including a signaling action and a power management action. Similarly, the invention is not limited in regard to the number of instructions and commands that can be received and acted upon, and in alternative embodiments may be operable to receive any number of instructions and commands, each resulting in a corresponding respective action being implemented. For example, and as will be described in further detail below, the device 10 of the described embodiment is operable to receive instructions and implement corresponding actions additional to the first and second instructions hereinbefore described, including third and fourth instructions relating to production of light or illumination between the limits or extremes of "on" and "off", that or partially on/off.

The controller 12 comprise processing means in the form of a processor.

The storage device 14 comprises read only memory (ROM) and random access memory (RAM).

The device 10 is operable to communicate via one or more communications link(s) (not shown) which may variously connect to one or more external or other devices (not shown) such as servers, personal computers, terminals wireless or handheld computing devices, landline communication devices, or mobile communication devices such as a mobile (cell) telephone. At least one of a plurality of communications links may be connected to an external computing network through a telecommunications network. The one or more communication link(s) may comprise al pluggably connectable communication device. The one or more communication link(s) implement machine input means, via which the device an receive at least one instruction from a machine, device or system.

The device 10 is capable of receiving instructions that may be held in the ROM or RAM and may be executed by the processor. The processor is operable to perform actions under control of electronic program instructions, as will be described in further detail below, including processing/executing instructions and managing the flow of data and information through the device 10.

The electronic program instructions are provided via a single software application ("app") or module which may be referred to as a control app. In the embodiment described, the device 10 and the app are marketed under the trade mark iQSwitch™. The app can be downloaded from a website (or other suitable electronic device platform) or otherwise saved to or stored on the storage device 14 the device 10. In the embodiment, the app relates to a basic switching operation as herein described. In embodiments of the invention, alternative software module providing electronic program instructions for more advanced operations, functions and actions, such as home automation, communication, or power management, may be installed, upgrading the device 10 accordingly.

The software app, or software, electronic instructions or programs for the computing components of the device 10, can be written in any suitable language, as are well known to persons skilled in the art. In embodiments of the invention, rather than being a single software app, the electronic program instructions may comprise a set or plurality of software, electronic instructions or programs and can be provided as stand-alone application(s), via a network, or added as middleware, depending on the requirements of the implementation or embodiment.

The device 10 also includes an operating system which is capable of issuing commands and is arranged to interact with the software app to cause the device to carry out the respective steps, functions and/or procedures in accordance with the embodiment of the invention described herein.

In alternative embodiments of the invention, the software may comprise one or more modules, and may be implemented in hardware. In such a case, for example, the modules may be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), microcontroller provided as on-chip configurable logic cells (CLC), and the like.

The computing means can be a system of any suitable type, including: a programmable logic controller (PLC); digital signal processor (DSP); microcontroller; personal, notebook or tablet computer, or dedicated servers or networked servers.

The processor can be any custom made or commercially available processor, a central processing unit (CPU), a data signal processor (DSP) or an auxiliary processor among several processors associated with the computing means. In embodiments of the invention, the processing means may be a semiconductor based microprocessor (in the form of a microchip) or a macroprocessor, for example.

In embodiments of the invention, the storage means, medium or device can include any one or combination of volatile memory elements (e.g., random access memory (RAM) such as dynamic random access memory (DRAM), static random access memory (SRAM)) and non-volatile memory elements (e.g., read only memory (ROM), erasable programmable read only memory (EPROM), electronically erasable, programmable read only memory (EEPROM), non-volatile random access memory (NVRAM), including flash memory, programmable read only memory (PROM), tape, compact disc read only memory (CD-ROM), etc.). The storage means, medium or device may incorporate electronic, magnetic, optical and/or other types of storage media. Furthermore, the storage medium can have a distributed architecture, where various components are situated remote from one another, but can be accessed by the processing means. For example, the ROM may store various instructions, programs, software, or applications to be executed by the processing means to control the operation of the device 10 and the RAM may temporarily store variables or results of the operations.

The use and operation of computers using software applications is well-known to persons skilled in the art and need not be described in any further detail herein except as is relevant to the present invention.

Furthermore, any suitable communication protocol can be used to facilitate communication between any subsystems or components of the device 10, and the device 10 and other devices or systems, including wired and wireless, as are well known to persons skilled in the art and need not be described in any further detail herein except as is relevant to the present invention.

Where the words "store", "hold" and "save" or similar words are used in the context of the present invention, they are to be understood as including reference to the retaining or holding of data or information both permanently and/or temporarily in the storage means, device medium for later retrieval, and momentarily or instantaneously, for example as part of a processing operation being performed.

Additionally, where the terms "system", "device", and "machine" are used in the context of the present invention, they are to be understood as including reference to any group of functionally related or interacting, interrelated, interdependent or associated components or elements that may be located in proximity to, separate from, integrated with, or discrete from, each other.

Furthermore in embodiments of the invention, the word "determining" is understood to include receiving or accessing the relevant data or information.

The input means 16 may comprise one or more sensors or detectors operable to sense data relating to or associated with the operation, the instruction and/or the command and to communicate the sensed data to the controller 12. The data communicated may comprise the instruction or command and/or a representation thereof. The sensors may comprise, for example, an embedded motion or proximity sensor. Additionally, or alternatively, the sensors may comprise one or more of: an ambient light sensor, a sound sensor, an infrared (IR) sensor, and a reader such as a security card reader. It should be appreciated that the invention is not limited in this regard, and in alternative embodiments any appropriate sensor or combination of sensors may be used.

In preferred embodiments of the invention, the device 10 is adapted for connection to a plurality of input means 16, which may each comprise a different input device, and/or a plurality of output means, which may each comprise a different output device. The adaption preferably comprises a set of connections for connecting selected input means 16 and/or selected output means to the device 10.

At least one of the input means 16 preferably comprises user input means 18, operable to allow instructions to be inputted by a user. Preferably, and in the embodiment described, the device 10 further comprises at least one output means in the form of a display 20 for displaying a user interface 22.

The display 20 may comprise a static d splay, and/or; dynamic display. In the case of a dynamic display, it may comprise a graphical display screen operable to be altered or updated electronically. The screen may comprise, for example, a liquid crystal display (LCD). Additionally, or alternatively, the display may comprise an indication means, which may comprise any one or more of: a visual indication, provided by one or more light sources such as a Light Emitting Diode (LED), for example; a tactile indication, provided by one or more tactile sources such as a vibration generating device, for example; and/or an aural indication, provided by one or more aural sources, such as a buzzer or alarm, for example.

The display 20, user interface 22 and input means 16 may be integrated, to allow for instructions to be inputted or received, and for output or feedback to be displayed. The output or feedback displayed may comprise a visual output, preferably including alphabetic, numeric and/or graphics, a tactile output, and/or an aural output, or a combination thereof, depending on the implementation.

In the embodiment of the invention, the display 20 for displaying the user interface 22 and the user input means 18 are, integrated in a touchscreen 24. In alternative embodiments these components may be provided as discrete elements or items.

The touchscreen 24 of the embodiment is implemented using Projected Capacitive Touch (PCT) technology and is operable to sense or detect the presence and location of a touch and/or a gesture within a display area of the device 10. Sensed "touchings" of the touchscreen 24 and/or "gestures" within range are inputted to the device 10 as commands or instructions and communicated to the controller 12. In alternative embodiments of the invention, other touchscreen technologies may be used, including Resistive Touch, and/or Inductive Touch technology, for example. It should be appreciated that the user input means is not limited to comprising a touchscreen, and in alternative embodiments of the invention any appropriate device, system or machine for receiving input, commands or instructions may be used. In the embodiment described, once the control app is installed on the device 10, the controller 12 is operable, under control of the control app, to present, via the touchscreen 24, a sequence of electronic pages, screens and forms to user or operator of the device 10 allowing for the inputting or capture of instruction or commands pertinent to an operation to be implemented.

In embodiments of the invention, for example comprising a static display, only a printed screen finish with graphics and LEDs may be provided, rather than an active user interface.

Preferably, the storage device 14 additionally stores information and/or data. The information and/or data may relate to or be associated with the operation, and may comprise an action to be implemented upon receipt of a corresponding command instruction. Additionally, or alternatively, it may relate to or be associated with one or more of the devices or systems coupleable to the device 10, or to one or more images displayable via the touchscreen 24, for example. In alternative embodiments of the invention, additional or alternative information or data may be stored.

In such embodiments, it is preferred that the controller 12 is operable, under control of the electronic program instructions, to display a list of available information and/or data via the touchscreen 24, and that the instructions comprise a set up command comprising a selection of the available information and/or data from the list, the selection specifying how the device 10 will function thereafter until an alternative selection is made. In this manner, the user is able to advantageously customize the function of the device 10 and what is displayed via the touchscreen 24.

At least some of the information and/or data, and selections made, are stored or saved in a database 26 or databank residing on the storage device 14 and accessible by the controller 12 under control of the control app. These may be installed as part of the app. The controller 2 is arranged to interact with the database 26 to cause the device 10 to carry out the respective steps, functions and/or procedures, in accordance with the embodiment of the invention described herein.

Others of the information and/or data are stored or saved remotely, for example in one or more remote databases residing on respective storage means, mediums or devices of one or more remote systems or devices and accessible by the device 10 via the one or more communications link(s). The controller 12 is arranged to facilitate user interaction with the one or more remote databases, to make the remotely stored information or data available.

It will be understood that the database(s) may reside on any suitable storage device, which may encompass solid state drives, hard disc drives, optical drives or magnetic tape drives. The database(s) may reside on a single physical storage device (as in the embodiment described) or may be spread across multiple storage devices.

The database 26 is coupled to the controller 12 and in data communication therewith in order to enable information and data to be read to and from the database 26 as is well known to persons skilled in the art. Any suitable database structure can be used, and there may be one or more than one database. In embodiments of the invention, the database 26 can be provided locally as a component of the device 10 (such as in the storage device 14) or remotely such as on a remote server, as can the electronic program instructions. In an embodiment, several computers or devices can be set up in this way to have a network client-server application.

In the embodiment, the controller 12 and the storage device 14 are housed within a container or housing in the form of a pattress box 28. The shape and dimensions of the pattress box 28 are such that they comply with standard sizes accepted in industry or otherwise regulated, allowing the device 10 to be retrofitted to any existing wiring within a home or commercial building or other structure as well as being installed in new constructions. The pattress box 28 is provided with ports (not shown) facilitating the operative coupling of the device 10 to one or more external or remote devices or systems, where wiring is required. The ports in the embodiment are an implementation of the abovementioned adaption for connecting selected input means 16 and/or selected output means to the device 10.

Means for closing the controller 12 and the storage device 14 within the housing 28 is provided in the form of a protective cover 30. The cover 30 seals the housing 28 and functions as a protective layer, preventing users from making physical contact with electrically live electronic components of the device 10. Once sealed with the cover 30, this combination of components may be considered a first part or "half" of the device 10.

As depicted in FIGS. 4A to 4D, in the embodiment, ports or apertures 30A are provided in the cover 30 facilitating coupling means for operably coupling or connecting an interchangeable faceplate 32 to the housing 28 and the controller 12 and storage device 14 contained therein.

Once connected or plugged together, the interchangeable faceplate 32 is provided adjacent or on top of the protective cover 30, and comprises the touchscreen 24 and a front cover 34. Between the touchscreen 24 and the front cover 34 facing means in the form of a fascia 36 may be removeably retained.

The combination of components forming the faceplate 32, which may be referred to as a switch face, may be considered a second part or "half" of the device 10. The coupling means may comprise any suitable couple, connection or attachment, including a fixed connector and/or a flexible connector, allowing the two parts or halves of the device 10 to be operably "plugged" together. In this regard, any suitable means for coupling the two parts of the device 10, or components thereof, together, may be used. These may include, for example, mounting options of at least one of clips, magnetic connections, press fit, and adhesive.

In alternative embodiments of the invention, the second part of the device 10 may comprise additional and/or alternative input means 16 and/or output means, and a plurality of interchangeable second part devices (including the switch face as described), which may have the form of modules, may be provided for connecting to the first part of the device 10 as desired. Such modules may include at least one of: a nurse call point (described in further detail hereafter); a communications system such as an intercom (with or without video capability); security devices such as a biometric reader, card reader, and radio-frequency identification (RFID) reader; and an input keypad. In embodiments of the invention, a wide range of interchangeable modules may be provided for a user to interact with.

In alternative embodiments of the invention, the touchscreen 24 (or other components of the input means, user interface, and display as appropriate) are contained within, or otherwise fixed to, the housing 28 so that it is provided as part of a unit with the controller 12 and the storage device 14. In such embodiments, the interchangeable faceplate 32 comprises the front cover 34 and (optionally) the facing means.

In the embodiment described, the front cover 34 is fabricated from a clear or transparent plastic material so that the fascia 36 is visible thereunder and protected thereby. The front cover 34 is preferably adapted to prohibit or mitigate to at least some extent retention and/or transmission of at least one pathogen. In the embodiment, the front cover 34 comprises a smooth or substantially smooth surface 34A, free from any irregularities, roughness, or projections. This provides hygiene benefits as it makes the front cover 34 easy to clean, and there are no grooves or recesses in the faceplate 32 in which pathogens may become lodged or harboured.

In alternative embodiments, the front cover 34 may be fabricated from additional or alternative materials or a combination thereof, including, for example, glass or metal. For increased hygiene in health care, hospitality, or industrial environments, for example, the front cover 34 may advantageously comprise antibacterial material such as one comprising inherently antibacterial silver ions. For use in some environments, such as schools, parks or public spaces, for example, where vandalism is common, the front cover 34 may itself act as or be provided with a protective outer surface, to mitigate or prevent damage of the device 10 by vandalism.

The interchangeable outer plastic Payer of the faceplate 32 allows users to change the front fascia 36 safely, without making contact with live electronics (shielded behind the protective cover 30). Furthermore, there is no risk of water ingress as the inner pattress box 28 is watertight. As such, the embodiment of the invention is much safer than a traditional electric switch. Furthermore, as the software breaker lies within the switch (i.e. device 10) as opposed to a traditional fuse box, the embodiment also reduces or eliminates the risk of overload. A programmable overload switch may automatically trigger in the case of an overload condition being detected.

Once installed, in a wall for example, the only component of the device 10 visible through the front cover 34 is the fascia 36 (if present) or the touchsoreen 24 if the fascia 36 has been removed). Accordingly, in the embodiment, from a visual perspective the "switch" provided by the device 10 is either the fascia 36 or the touchscreen 24, as appropriate.

As hereinbefore described, a major issue with traditional wall-mounted electric switches is that the consumer is subjected to the designs created by the manufacturers. Not just any switch on the market suits unique décor elements such as coloured paint, wallpaper or panelling, for example.

The faceplate 32, and fascia 36, comprise interchangeable interface design panels that may be provided with any desired features, including those of shape, configuration, pattern and/or ornamentation of any colour, and can be removeably inserted into position and changed as often as a user wishes. By changing the faceplate 32 and/or the fascia 36, the visual features of the "switch" provided by the device 10 can be be easily designed to match the consumer's individual specifications, such as a switch that follows the pattern of wallpaper, or a child-friendly colour scheme or shape, or a modern, multi-functional switch for a living room, for example, or any other personal taste.

In the embodiment, via an online applications shop, store or website, a user is able to communicate a specification for a desired or custom "switch" design to a provider. The specification specifies one or features desired by the user, including shape, colour, and graphics images, for example and whether a new faceplate 32 and/or fascia 36 is desired. The provider is able to provide the required item in one of two ways in the embodiment, depending on the specification order. One is as a completely new faceplate that allows the user to unplug the current faceplate 32 and install the new one. This allows for changes to features such as shape and size as well as colour, image and/or texture. The new faceplate may be transported to the user. The second is as an artwork insert, only, that is a replacement fascia 36 that allows the user to change the features of pattern and or ornamentation of the design but not the size or shape, and which may be downloaded and printed by the user via an appropriate device, or transported to the user. Both types are compatible with the same rear parts, i.e. the first half of the device 10, and are fully interchangeable. They may be clipped in/clipped out. In the described embodiment, changing the previous faceplate 32 and/or fascia 36 for the new ones will not expose the user to 240V AC and is allowable under current regulations (where required) in Australia that prohibit works on 240V AC switches unless the person carrying out the works is a licensed electrician.

Figure 5A:
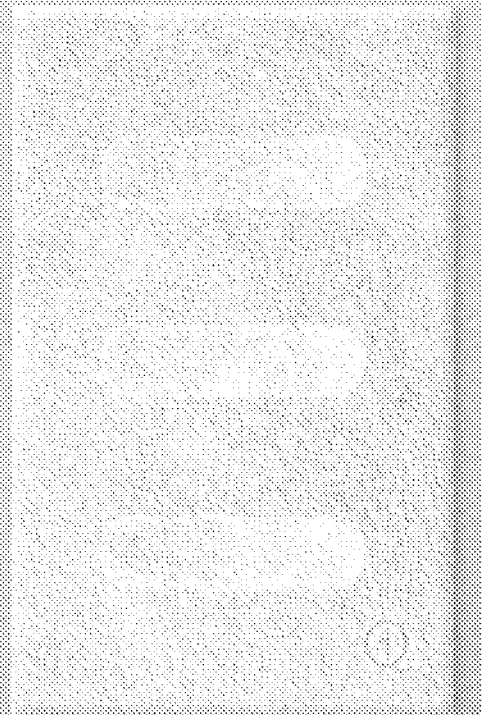
FIGS. 5A to 5T depict examples illustrating the customizable nature of the interface of the device of FIG. 1.
Figure 5C:
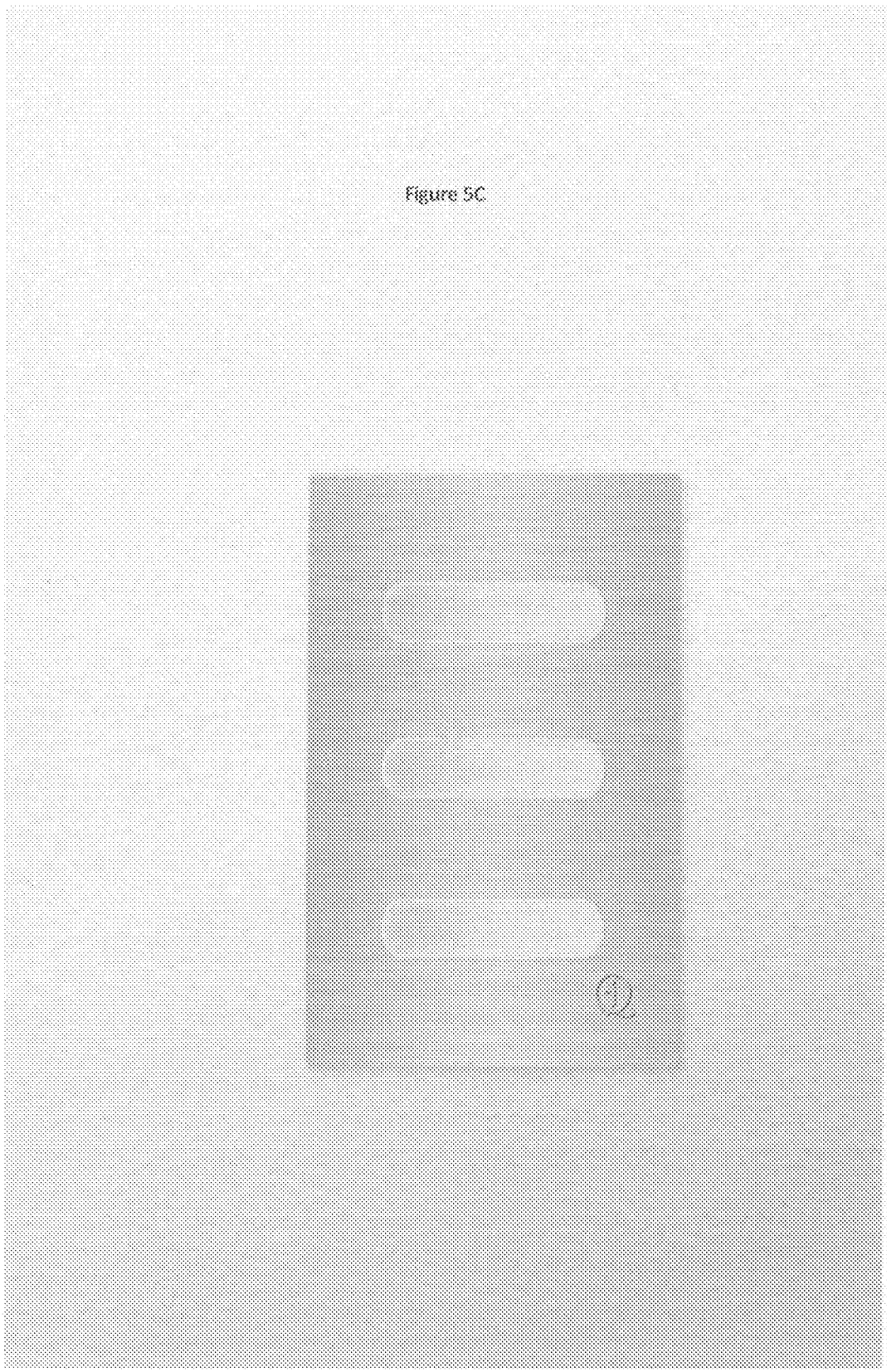
Figure 9B:
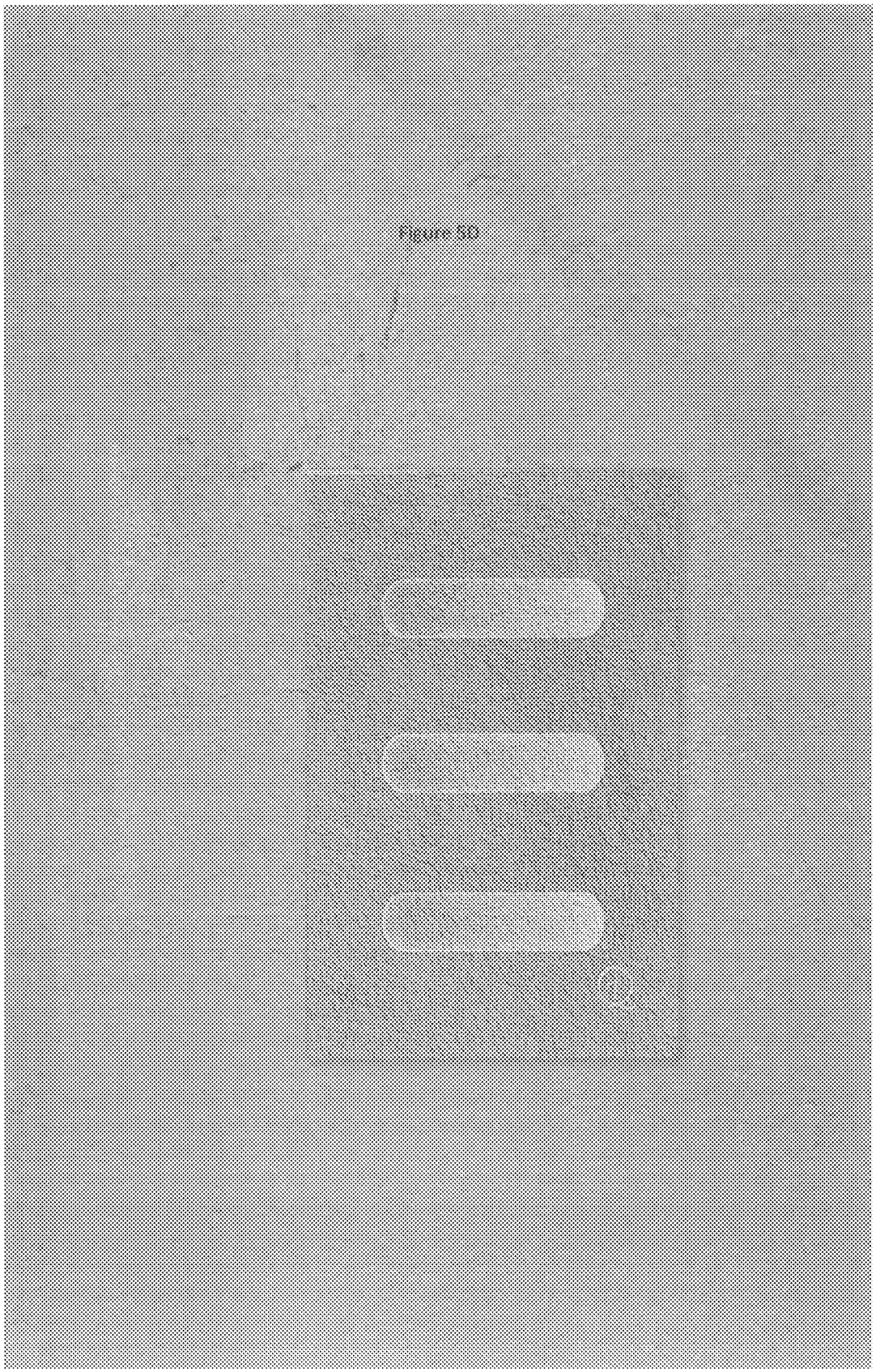
Figure 5E:
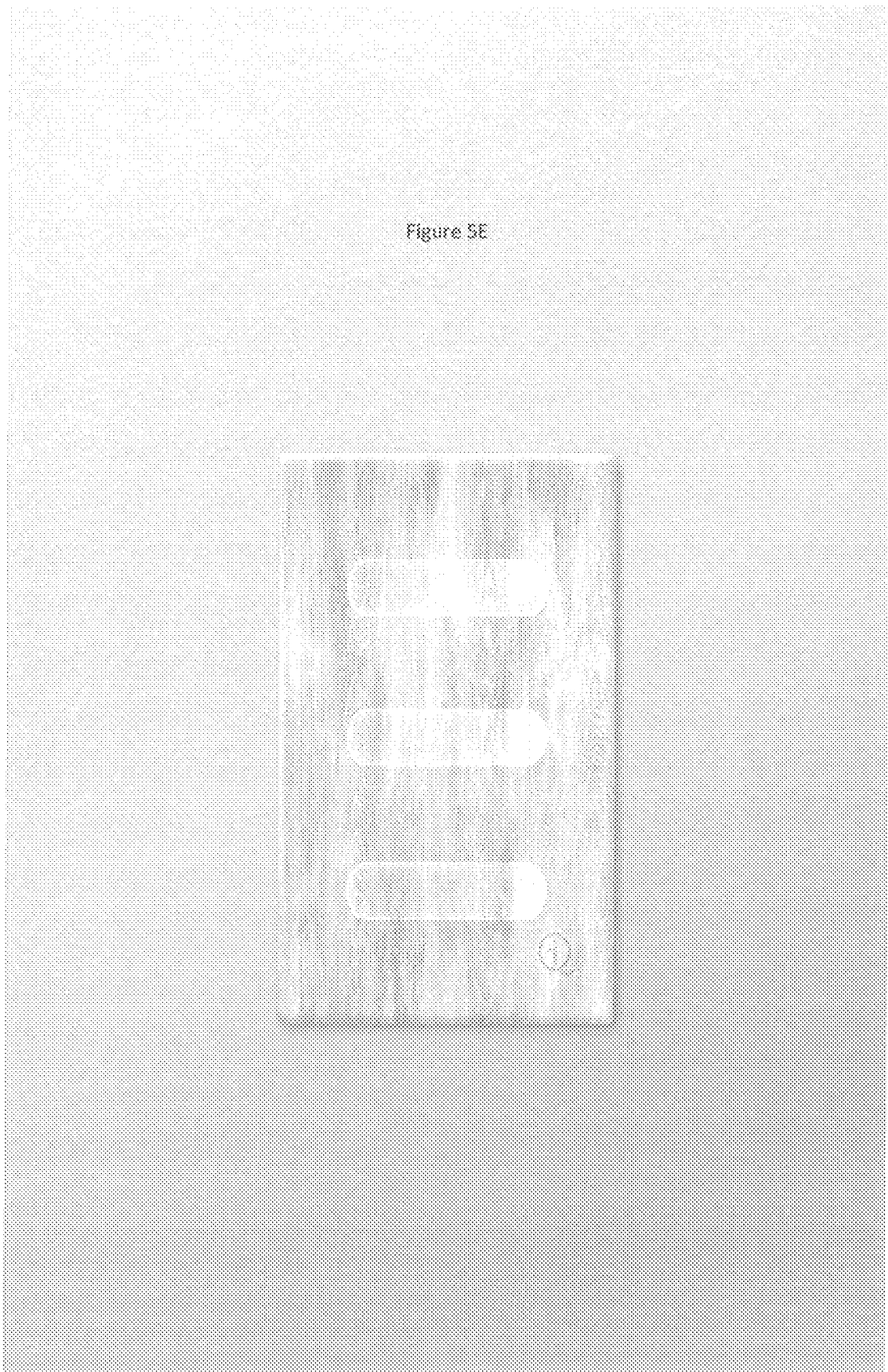
Figure 5G:
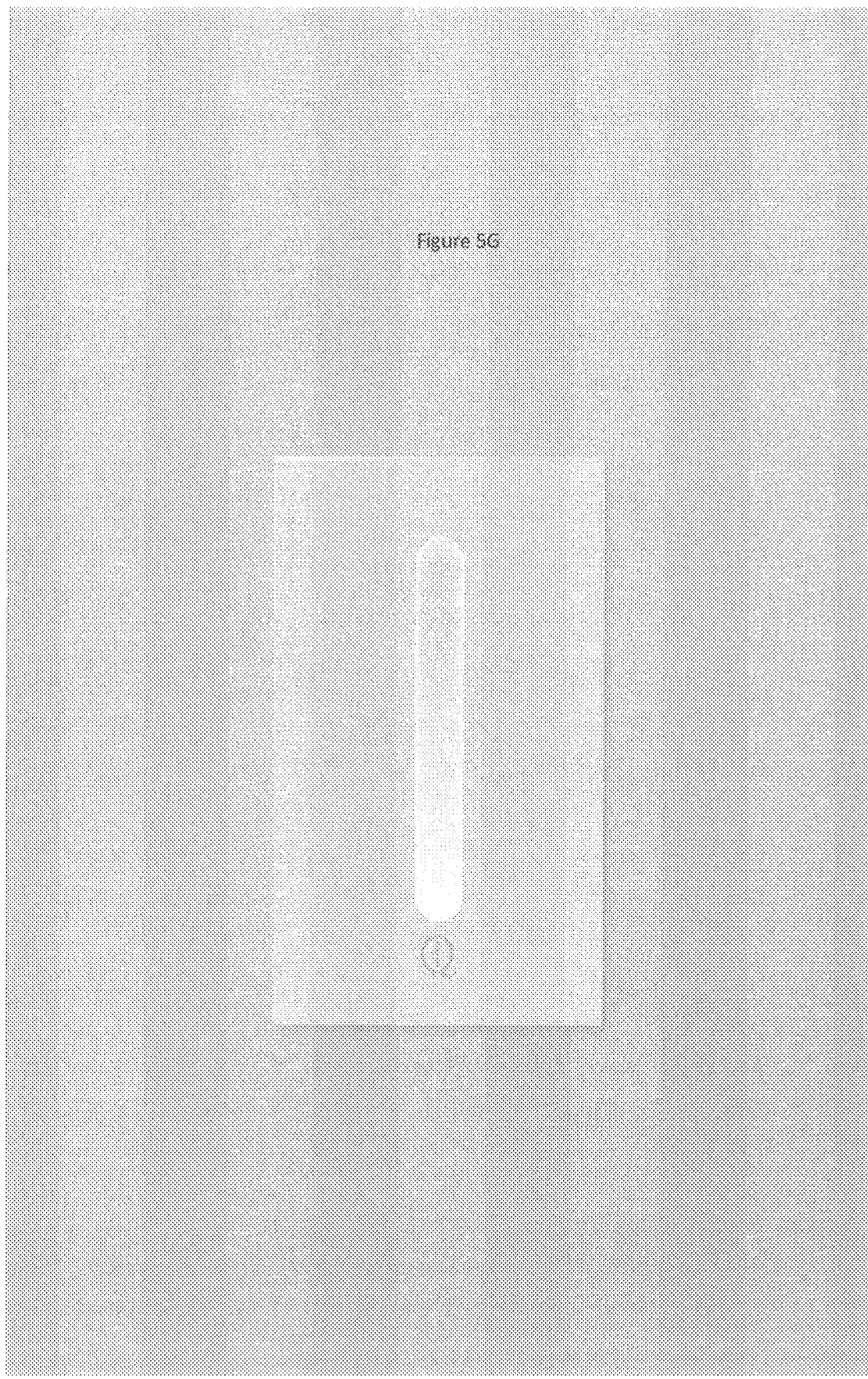
Figure 5H:
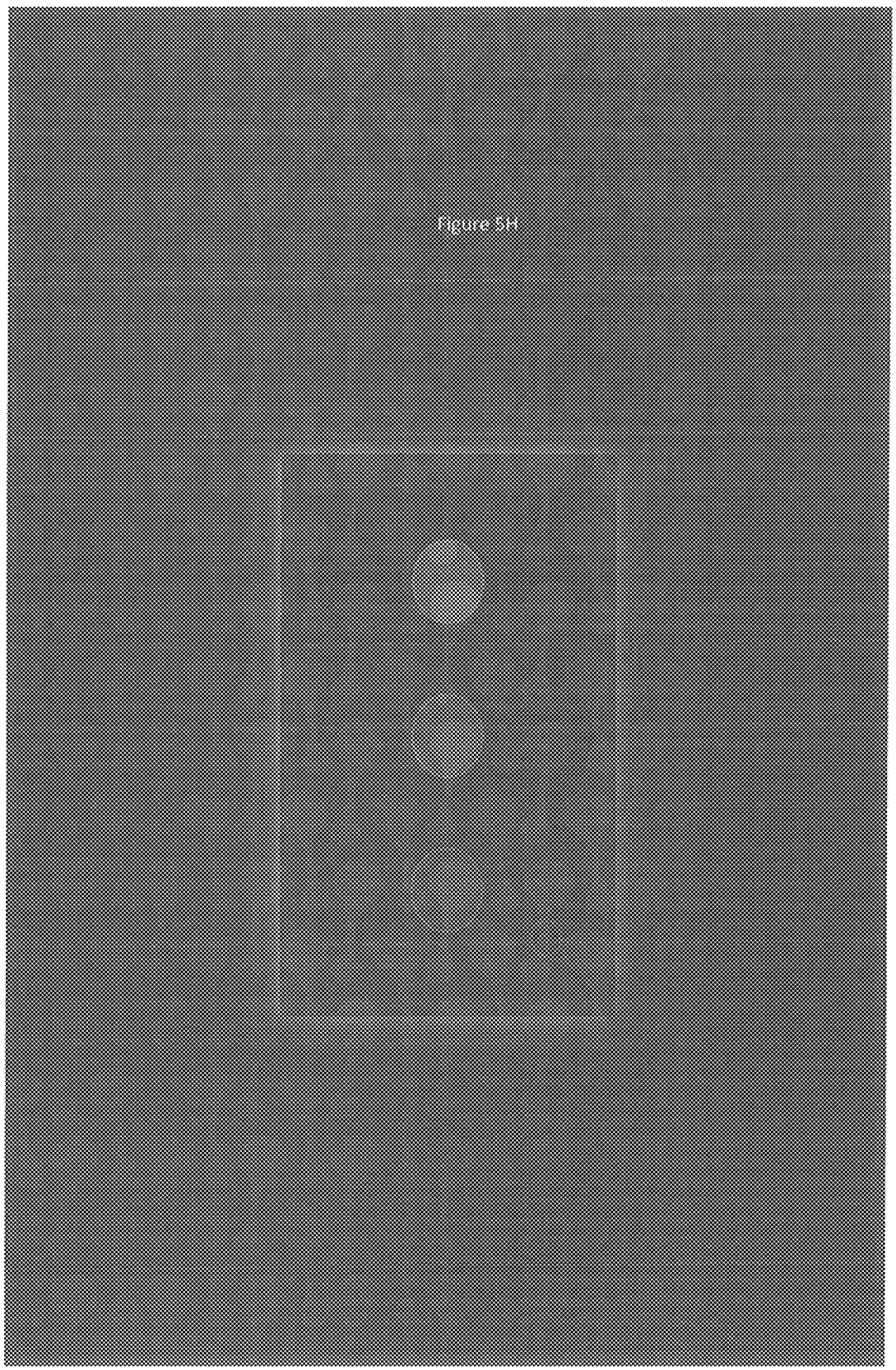
Figure 5J:
Figure 5K:
Figure 5L:
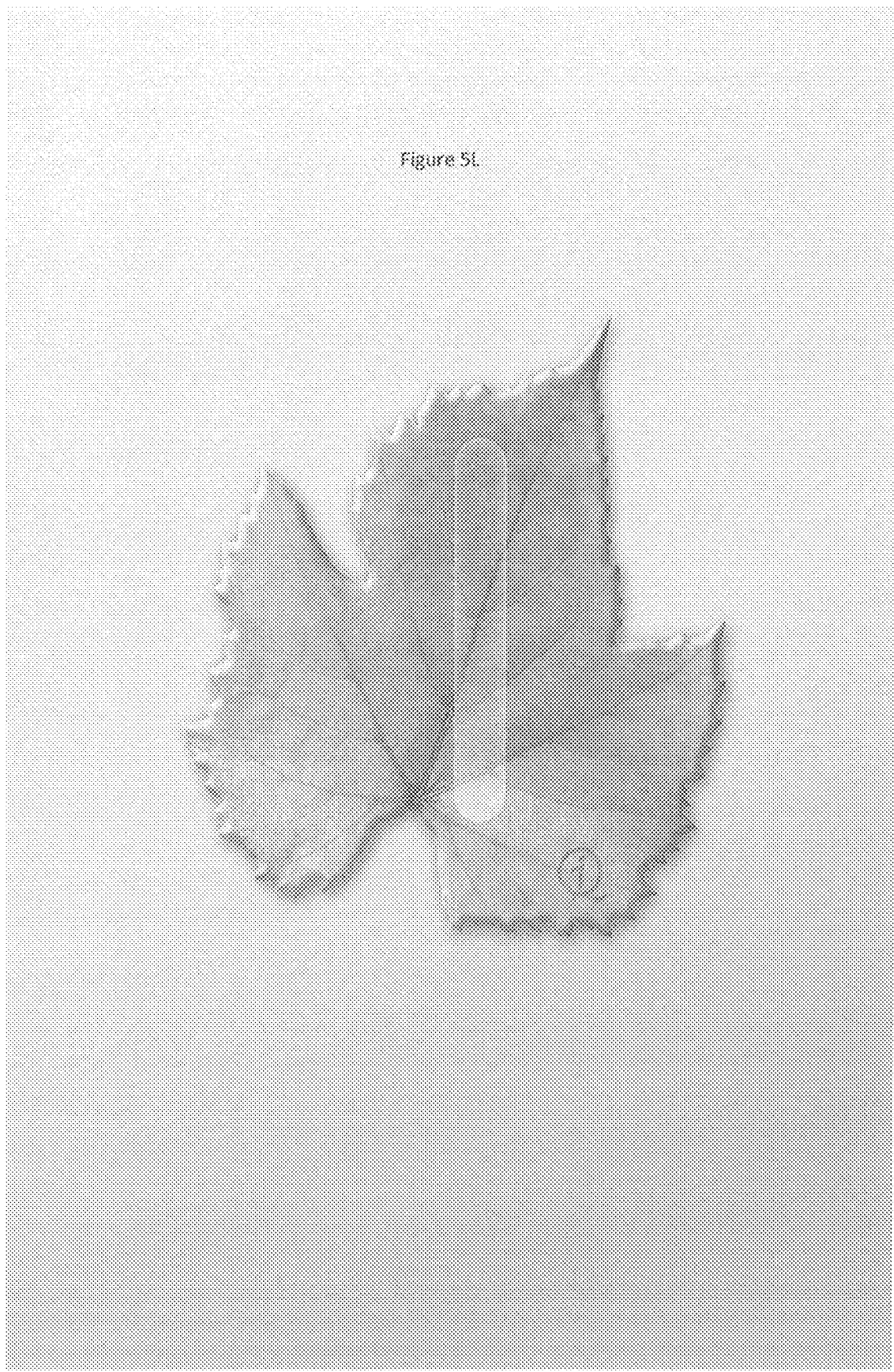
Figure 5N:
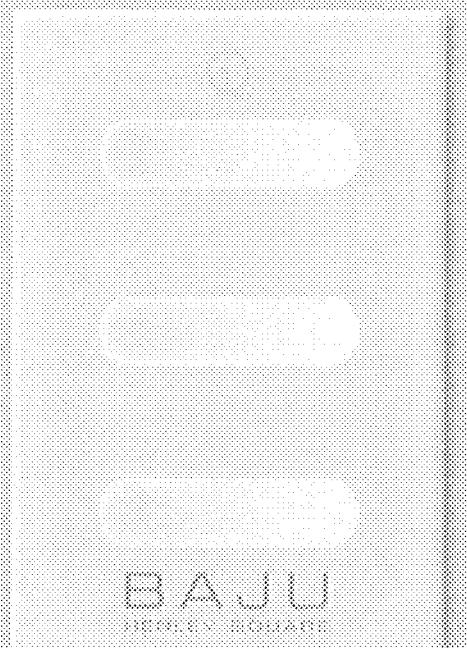
Figure 5:
Figure 5P:
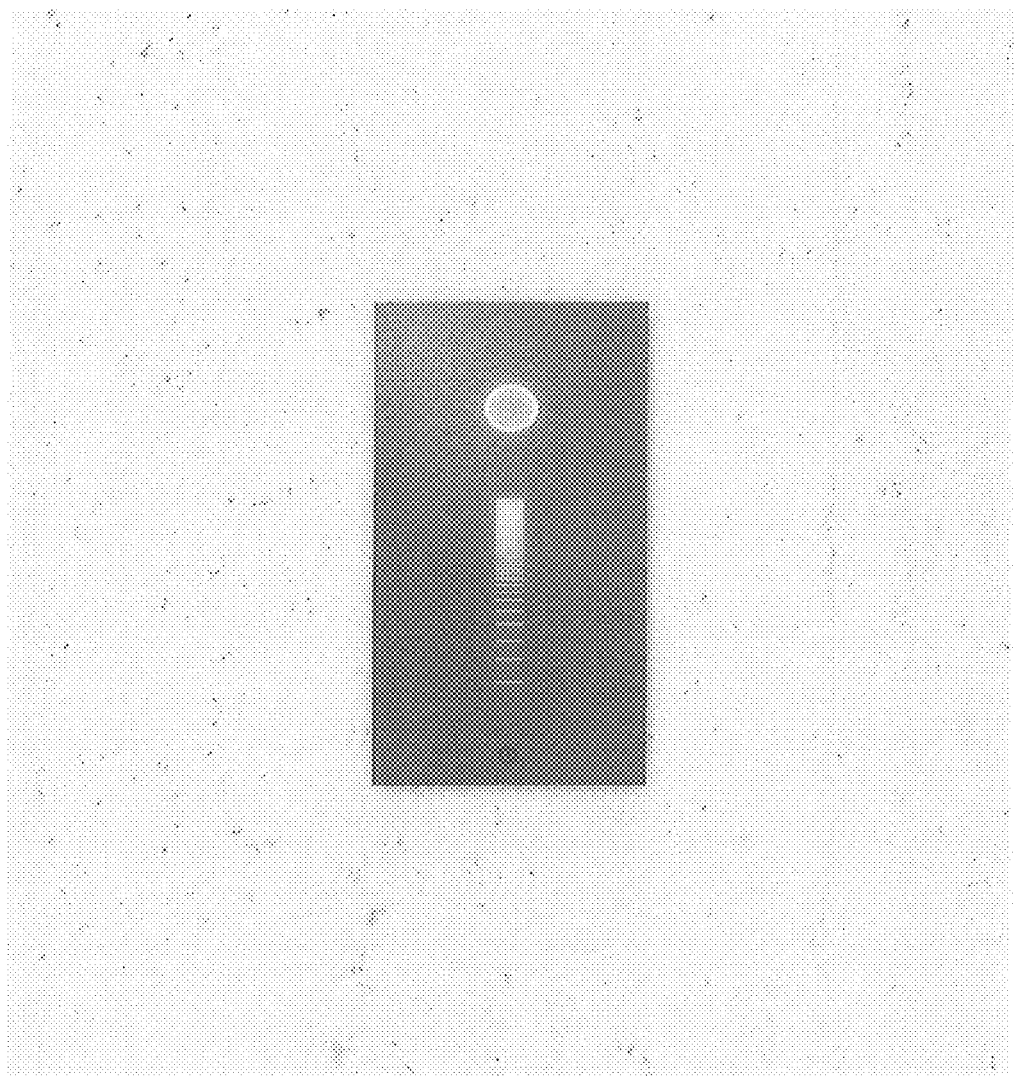
Figure 5Q:
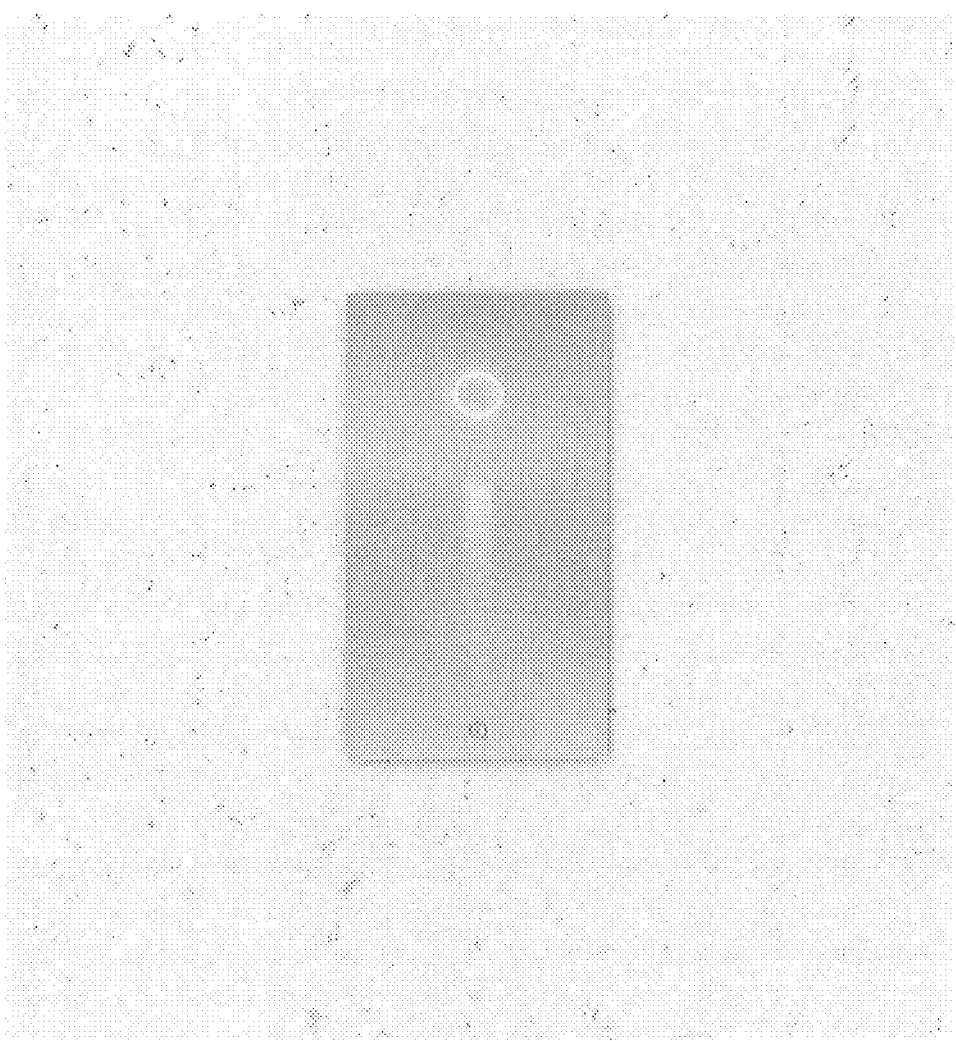
Figure 9R:
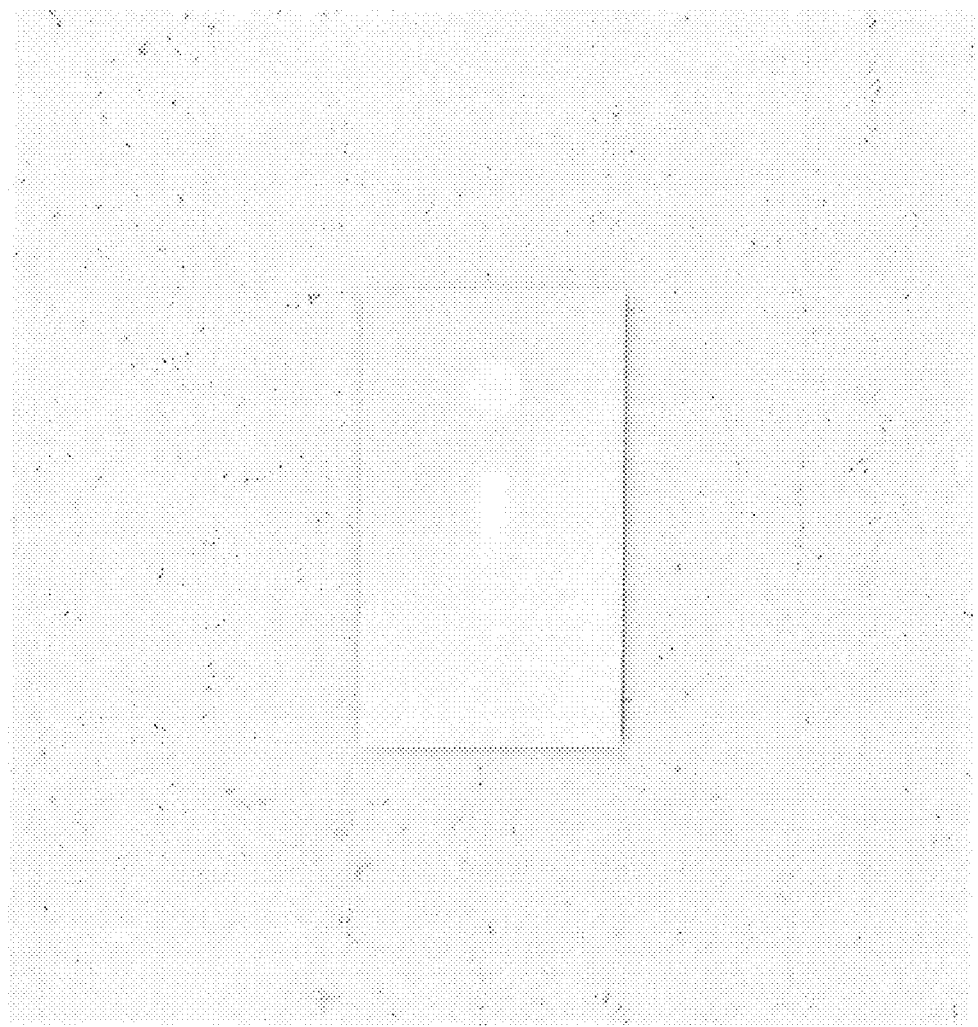
Figure 5S:
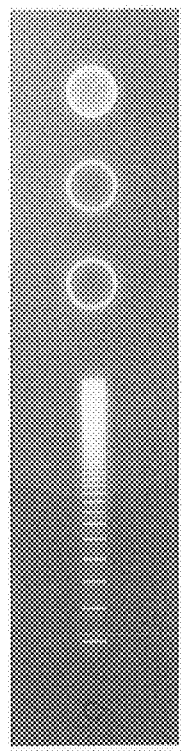
Figure 5T:
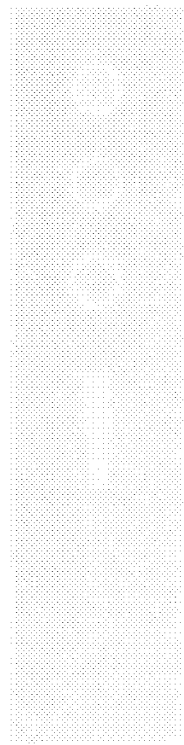

FIGS. 5A to 5S depict examples it lustrating the customisable nature of the interface of the device 10.

In the embodiment described and depicted in the drawings, as the device 10 is intended to control an operation comprising a switching action in respect of a light, the fascia 36 comprises images in the form of a first representation 36A of light bulb, a second representation 36B of a light bulb with a "+" or increase illumination indication, and a third representation 36C of a light bulb with a "−" a or decrease illumination indication.

When the fascia 36 is retained adjacent the touchscreen 24, the first representation 36A is positioned such that touching of it by a user will be sensed by the touchscreen 24 and inputted to the device 10 as a first instruction (if presently in the second state) or a second instruction (if presently in the first state) and communicated to the controller 12 as hereinbefore described.

The second representation 36B is positioned such that touching of it by will be sensed by the touchscreen 24 and inputted to the device 10 as a third instruction comprising a third or "increase illumination" command, upon receipt of which the device 10 is operable to implement a third or "increase illumination" state, or to otherwise signal the lighting apparatus, to enter a third state or mode of operation. The third state or mode of operation of the lighting apparatus may comprise an "increase illumination" condition, in which the brightness of the light produced is increased.

The third representation 36C is positioned such that touching of it by a user will be sensed by the touchscreen 24 and inputted to the device 10 as a fourth instruction comprising a fourth or "decrease illumination" command, upon receipt of which the device 10 is operable to implement a fourth or "decrease illumination" state, or to otherwise signal the lighting apparatus, to enter a fourth state or mode of operation. The fourth state or mode of operation of the lighting apparatus may comprise an "decrease illumination" condition, in which the brightness of the light produced is decreased.

In cases where the fascia 36 has been removed, and the "switch" provided by the device 10 is the touchscreen 24, selected image(s) may be generated and displayed via the touchsereen 24 as hereinbefore described to provide the desired visual appearance for the "switch".

It can be appreciated that the embodiment of the invention provides a "switch" which has a modular nature and allows for variations, whereas switches of the prior art tend to be fixed in nature as hereinbefore described.

In embodiments of the invention, a "basic" switch (or GPO where such functionality is provided as hereinbefore described) is formed by attachment of the switch for other function) face, which may be any appropriate size or shape, of the second part of the device 10 to the first part (which may be referred to as a basic switching unit) of the device 10. The addition of the communication capability provided by the one or more communications link(s) results in the device 10 being an intelligent connected switch. Advantages are provided by such embodiments in that they allow a user to determine and select the level of sophistication and features of the switch as well as how they communicate with it.

In addition to use as an alternative to traditional wall mounted electric switches, embodiments of the invention are particularly suited to application in splashbacks and nurse call systems.

Glass splashbacks are a popular item in bathrooms, kitchens and commercial environments where water and other fluids are prone to splash.

Installing a traditional electric switch near or on a splashback extremely dangerous because of the risk of water ingress into the switch and electrocution.

Embodiments of the invention can be installed behind a glass (or other) surface of the splashback, with the splashback surface taking the place of the front cover 34 in the embodiment described, thereby eliminating the risk of water ingress.

In such an embodiment, the display of the device 10 comprises LED indicators operable to shine or transmit light through the glass of the splashback. These remain switched off until a sensor in the form of an embedded motion or proximity sensor of the device 10 installed behind the glass detects motion. Upon such an event, the LEDs illuminate to show the user the key areas of the glass for switching, that is those portions of the glass proximate to the user input means. The device 10 further comprises timing means in the form of a timer operable to turn off the LEDs after a set time period or duration after the last input from the user. Alternatively, there may not be a motion or proximity sensor and the first touch detected will activate the LEDs and again a timer switches them off after a preset time. There may also be an indicator LED operable to show a user where the switch, i.e. device 10, is located behind the splashback. This may be steadily lit or pulsing at a preset interval.

Such an application of the invention may be highly attractive for a consumer interested in an aesthetically appealing look since the switch remains essentially hidden from view when not in use. It only becomes visible upon a sensed motion, such as a wave of the hand, before fading again into the background after use.

It can be appreciated that such an application allows for a very hygienic installation and has safety benefits in that water ingress is not possible or at least mitigated.

A nurse call unit is a device that allows patients in health care to call for help. Some comprise a simple emergency assist button and others allow for verbal communication. A nurse call unit is typically found near the patient's bed, and is essential for a bedridden patient in times of need, or for a nurse or loved one who requires additional assistance.

Ultimately, nurse call buttons provide patients with a sense of security, and for the staff members and loved ones, peace of mind.

The traditional format of the nurse call system is flawed, however, as it possesses all of the issues inherent in traditional switches. But while a faulty traditional switch in a home or office is wearisome, a faulty nurse call switch has the potential to be fatal.

Embodiments of the invention are ideal as a nurse call unit because they are reliable, safe and customisable to the needs of a medical centre. For example, in medical centres, combinations of light switches and call points in a single unit allow for easy access to emergency assistance call when needed. A code blue, for example, could be called from any switch in a building instead of only at specific points.

As described previously, embodiments of the invention allow for hygienic installation in situations where it is critical.

The above and other features and advantages of the embodiment of the invention will now be further described with reference to the device 10 in use.

A user installs and executes the software application of the device 10.

The user then interfaces with the device 10 and provides user instructions via the touchscreen 24. The device 10 operates to implement the operation in accordance with the user instructions and commands received.

As desired, the user varies the faceplate 32 and/or fascia 36, and other modules of the device 10 in embodiments where provided.

It will be appreciated that the embodiment of the invention provides several advantages.

Firstly, embodiments of the invention are fully customizable. Unlike the manufacturer-defined traditional switches, the device 10 of the embodiment is not constrained by a predetermined fixed form. Consumers are therefore in control of the shape, colour, material, function and size of the 'switch'—a of which can be easily and frequently changed as tastes and trends change over time.

Furthermore, the embodiment of the device 10 has no moving parts or components—it is purely electronic. All features of the switching operation are controlled electronically instead of s with standard switching, all or part via mechanical or electro-mechanical contacts.

It will be appreciated by those skilled in the art that variations and modifications to the invention described herein will be apparent without departing from the spirit and scope thereof. The variations and modifications as would be apparent to persons skilled in the art are deemed to fall within the broad scope and ambit of the invention as herein set forth.

Throughout the specification and claims, unless the context requires otherwise, the word "comprise" or variations such as "comprises" or "comprising", will be understood to imply the inclusion of a stated integer or group of integers but not the exclusion of any other integer or group of integers.

Throughout the specification and claims, unless the context requires otherwise, the term "substantially" or "about" will be understood to not be limited to the value for the range qualified by the terms.

It will be clearly understood that, if a prior art publication is referred to herein, that reference does not constitute an admission that the publication forms part of the common general knowledge in the art in Australia or in any other country.

The invention claimed is:

1. A device for controlling an operation of an apparatus electrically connected thereto, the device comprising:
   a first part comprising a housing with shape and dimensions that comply with standard sizes accepted in industry or otherwise regulated for allowing the device to be installed in a wall and fitted to any existing wiring within a home or commercial building;
   a controller housed within the housing;
   a storage device for storing electronic program instructions for controlling the controller; and
   a second part comprising a first removable input device attachable to the first part of the device;
   wherein the controller is operable, under control of the electronic program instructions, to:
      receive at least a first instruction via the first removable input device when it is attached to the first part of the device for controlling an operation, the first instruction comprising a command associated with the operation of a first electrical apparatus; and
      implement the operation according to the command;
   wherein the first removable input device is adapted to be replaced with a second removable input device attachable to the first part of the device for controlling an operation; and
   wherein when the second removable input device is attached to the first part of the device for controlling an operation it is adapted to enable at least a second instruction to be received by the controller, the second instruction comprising a second command associated with the operation of the first electrical apparatus or a second electrical apparatus; and
   wherein the controller is operable to implement the second operation according to the second command.

2. The device of claim 1, further comprising an output device.

3. The device of claim 2, further comprising a connection device for operably connecting and disconnecting at least one of the first or second removable input device and the output device to the device.

4. The device of claim 3, wherein at least one of the first or second removable input device and the output device comprise modules interchangeably connectable to the device.

5. The device of claim 1, wherein the controller comprises a computer processor, and the first or second instruction comprises, or is converted by operation of the first or second removable input device, into data or at least one signal for the computer processor.

6. The device of claim 1, wherein the first or second removable input device comprises at least one of: user input device, and the first instruction comprises at least one user instruction inputted by a user via the user input device; and machine input communication device, operable to provide a communication link to communicate with, and receive at least one instruction from a machine, device or system.

7. The device of claim 1, wherein the first or second removable input device comprises one or more sensors operable to sense data relating to or associated with the operation, the instruction and/or the command and to communicate the sensed data to the controller.

8. The device of claim 4, wherein the data communicated comprises at least one of the instructions or command and a representation thereof.

9. The device of claim 2, wherein the output device comprises a display for displaying a user interface.

10. The device of claim 9, wherein the display comprises at least one of: a static display; a dynamic display; a graphical display screen operable to be altered or updated electronically; an indication means comprising a visual indication provided by one or more light sources; a tactile indication provided by one or more tactile sources; and an aural indication provided by one or more aural sources.

11. The device of claim 9, wherein the display, user interface, and first or second removable input device are integrated, to allow for instructions to be inputted or received, and for output or feedback to be displayed.

12. The device of claim 11, wherein the integration comprises a touchscreen.

13. The device of claim 12, wherein the touchscreen is implemented using at least one of Projected Capacitive Touch, Resistive Touch, and Inductive Touch technology.

14. The device of claim 11, wherein the output or feedback displayed comprises at least one of: a visual output including at least one of alphabetic characters, numeric characters, and graphics; a tactile output, and an aural output, or a combination thereof.

15. The device of claim 9, wherein the display comprises a changeable fascia.

16. The device of claim 9, wherein the display is protected by a removable cover.

17. The device of claim 16, wherein the cover is adapted to prohibit or mitigate to some extent at least one of retention and transmission of at least one pathogen.

18. The device of claim 17, wherein the cover is smooth or substantially smooth.

19. The device of claim 16, wherein the cover is fabricated from at least one of a plastic, glass, metal, and antibacterial material.

20. The device of claim 19, wherein the antibacterial material comprises inherently antibacterial silver ions.

21. The device of claim 1, wherein the operation comprises at least one of: a switching action; a signaling action; a recording action; a data logging action; and a power management action.

22. The device of claim 1, wherein the storage means is operable to store information or data associated with the operation.

23. The device of claim 22, wherein the controller is operable, under control of the electronic program instructions, to display a list of available information or data via the display, and the command comprises a selection of the available information or data from the list.

24. The device of claim 1, wherein the first electrical apparatus and/or the second electrical apparatus comprises at least one device or system for:
   lighting; heating and cooling; communication; access control; power; and/or generating an alert or alarm or machine command.

25. The device of claim 1, wherein the second electrical apparatus is the same apparatus as the first electrical apparatus.

26. The device of claim 6, wherein the user input device is a touchscreen.

27. A method of controlling an operation of an apparatus electrically connected to a device, the method comprising:
   storing electronic program instructions for controlling a controller in a first part of the device, the first part of the device comprising a housing with shape and dimensions that comply with the standard sizes accepted in industry or otherwise regulated for allowing the device to be installed in a wall and fitted to any existing wiring within a home or commercial building; and controlling the controller via the electronic program instructions, to:

receive at least one first instruction via a first removable input device comprising a second part of the device when it is attached to the first part of the device, the first instruction comprising a command associated with an operation of a first electrical apparatus; and implement the operation according to the command;

wherein the first removable input device is adapted to be replaced with a second removable input device attachable to the first part of the device for controlling an operation; and wherein when the second removable input device is attached to the first part of the device it is adapted to enable at least a second instruction to be received by the controller, the second instruction comprising a second command associated with an operation of the first electrical apparatus or a second electrical apparatus; and wherein the controller implements the second operation according to the second command.

28. A computer-readable storage medium on which is stored instructions that, when executed by a controller, causes the controller to perform the method according to claim 27.

29. A controller programmed to carry out the method according to claim 27.

* * * * *

UNITED STATES PATENT AND TRADEMARK OFFICE
CERTIFICATE OF CORRECTION

PATENT NO. : 10,409,591 B2  
APPLICATION NO. : 14/423655  
DATED : September 10, 2019  
INVENTOR(S) : Mark Andrew Lapins et al.

Page 1 of 1

It is certified that error appears in the above-identified patent and that said Letters Patent is hereby corrected as shown below:

On the Title Page

(73) Assignee:
Lines 1-2 "Lapins Holdings Pty Ltd, as Trustee for the Lapins Family Trust (AU)" should be
--Quantify Technology Ltd (AU)--

Signed and Sealed this
Thirty-first Day of March, 2020

Andrei Iancu
*Director of the United States Patent and Trademark Office*